(12) United States Patent
Fazan et al.

(10) Patent No.: US 7,253,052 B2
(45) Date of Patent: *Aug. 7, 2007

(54) METHOD FOR FORMING A STORAGE CELL CAPACITOR COMPATIBLE WITH HIGH DIELECTRIC CONSTANT MATERIALS

(75) Inventors: Pierre C. Fazan, Boise, ID (US); Viju K. Mathews, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/896,442

(22) Filed: Jul. 22, 2004

(65) Prior Publication Data

US 2005/0003609 A1   Jan. 6, 2005

Related U.S. Application Data

(60) Division of application No. 09/489,954, filed on Jan. 24, 2000, now Pat. No. 6,791,131, which is a division of application No. 08/572,392, filed on Dec. 14, 1995, now Pat. No. 6,030,847, which is a continuation-in-part of application No. 08/390,336, filed on Feb. 17, 1995, now Pat. No. 5,478,772, which is a continuation of application No. 08/044,331, filed on Apr. 2, 1993, now abandoned.

(51) Int. Cl.
*H01L 21/8242* (2006.01)
*H01L 21/336* (2006.01)
*H01L 21/20* (2006.01)

(52) U.S. Cl. .................. 438/240; 438/239; 438/398; 438/399; 438/255

(58) Field of Classification Search ........ 438/238–240, 438/242, 253–256, 393–399; 257/296, 305, 257/306, 310
See application file for complete search history.

(56) References Cited

U.S. PATENT DOCUMENTS 3,728,694 A   4/1973   Rohrer .................. 340/173.2

(Continued)

FOREIGN PATENT DOCUMENTS

EP   0494313   7/1992

OTHER PUBLICATIONS

Fujii, E., et al., "ULSI DRAM technology with Ba/sub 0.7/Sr/sub 0.3/TiO/sub 3/film of 1.3nm equivalent SiO/sub 2/ thickness and 10/sup-9/ A/cm/sup 2/leakage current", *International Electron Devices Meeting 1992. Technical Digest*, (1992),267-270.

(Continued)

*Primary Examiner*—Shouxiang Hu
(74) *Attorney, Agent, or Firm*—Schwegman, Lundberg, Woessner & Kluth, P.A.

(57) ABSTRACT

Described are integrated circuit electrodes and method for fabricating an electrode, which include, in an embodiment forming a silicon, first portion of the electrode in a lower region of a substrate opening. The method may further include forming a second portion of the electrode in the opening and overlying the first portion, the insulative layer encompassing a sidewall of the second portion. The method may further include forming a third portion of the electrode overlying the second portion and overlying at least a portion of the insulative layer, wherein the first portion and the second portion are different materials. In an embodiment, the second portion is a diffusion barrier layer and the third portion is an oxidation resistant layer. In an embodiment, the method includes encompassing a lower sidewall of the third portion with the insulative layer.

12 Claims, 33 Drawing Sheets

U.S. PATENT DOCUMENTS

| | | | | |
|---|---|---|---|---|
| 3,939,292 A | 2/1976 | Rohrer | ................ | 427/55 |
| 4,195,355 A | 3/1980 | Rohrer | ................ | 365/145 |
| 4,458,410 A * | 7/1984 | Sugaki et al. | ................ | 438/647 |
| 4,623,912 A | 11/1986 | Chang et al. | ................ | 357/54 |
| 4,782,309 A | 11/1988 | Benjaminson | ................ | 331/139 |
| 4,903,110 A | 2/1990 | Aono | ................ | 357/51 |
| 4,910,578 A | 3/1990 | Okamoto | ................ | 357/71 |
| 4,966,868 A * | 10/1990 | Murali et al. | ................ | 438/232 |
| 4,982,309 A | 1/1991 | Shepherd | ................ | 361/321 |
| 5,005,102 A | 4/1991 | Larson | ................ | 257/296 |
| 5,046,043 A | 9/1991 | Miller et al. | ................ | 365/145 |
| 5,049,517 A | 9/1991 | Liu et al. | | |
| 5,049,975 A | 9/1991 | Ajika et al. | ................ | 357/71 |
| 5,053,351 A | 10/1991 | Fazan et al. | ................ | 437/52 |
| 5,053,917 A | 10/1991 | Miyasaka et al. | ................ | 361/321 |
| 5,098,860 A | 3/1992 | Chakravorty et al. | ................ | 432/195 |
| 5,099,305 A | 3/1992 | Takenaka | ................ | 357/51 |
| 5,111,355 A | 5/1992 | Anand et al. | ................ | 361/313 |
| 5,134,451 A | 7/1992 | Katoh | ................ | 361/321 |
| 5,140,389 A | 8/1992 | Kimura et al. | | |
| 5,162,248 A | 11/1992 | Dennison et al. | ................ | 437/52 |
| 5,168,073 A | 12/1992 | Gonzalez et al. | ................ | 437/47 |
| 5,171,713 A | 12/1992 | Matthews | ................ | 437/189 |
| 5,185,689 A | 2/1993 | Maniar et al. | ................ | 361/313 |
| 5,187,638 A | 2/1993 | Sandhu et al. | ................ | 361/313 |
| 5,189,503 A | 2/1993 | Suguro et al. | ................ | 257/310 |
| 5,198,384 A | 3/1993 | Dennison | ................ | 437/52 |
| 5,248,628 A | 9/1993 | Okabe et al. | ................ | 437/47 |
| 5,293,510 A | 3/1994 | Takenaka | ................ | 257/295 |
| 5,335,138 A | 8/1994 | Sandhu et al. | ................ | 361/303 |
| 5,340,765 A | 8/1994 | Dennison et al. | ................ | 437/52 |
| 5,366,920 A | 11/1994 | Yamamichi et al. | ................ | 437/52 |
| 5,381,302 A | 1/1995 | Sandhu et al. | ................ | 361/305 |
| 5,387,532 A | 2/1995 | Hamamoto et al. | ................ | 437/52 |
| 5,391,511 A | 2/1995 | Doan et al. | ................ | 437/49 |
| 5,392,189 A | 2/1995 | Fazan et al. | ................ | 361/305 |
| 5,396,094 A | 3/1995 | Matsuo | ................ | 257/310 |
| 5,401,680 A | 3/1995 | Abt et al. | ................ | 437/52 |
| 5,471,364 A | 11/1995 | Summerfelt et al. | ................ | 361/321.4 |
| 5,478,772 A | 12/1995 | Fazan | ................ | 437/60 |
| 5,489,548 A * | 2/1996 | Nishioka et al. | ................ | 438/396 |
| 5,506,166 A | 4/1996 | Sandhu et al. | ................ | 437/60 |
| 5,523,624 A * | 6/1996 | Chen et al. | ................ | 257/751 |
| 5,561,307 A | 10/1996 | Mihara et al. | ................ | 257/295 |
| 5,612,254 A * | 3/1997 | Mu et al. | ................ | 438/634 |
| 5,631,804 A | 5/1997 | New | ................ | 361/312 |
| 5,796,136 A | 8/1998 | Shinkawata | ................ | 257/306 |
| 5,973,344 A | 10/1999 | Ma et al. | ................ | 257/296 |
| 6,030,847 A * | 2/2000 | Fazan et al. | ................ | 438/3 |
| 6,066,528 A | 5/2000 | Fazan et al. | ................ | 438/253 |
| 6,071,770 A | 6/2000 | Roh | ................ | 438/240 |
| 7,153,707 B2 * | 12/2006 | Fazan et al. | ................ | 438/3 |
| 2006/0138510 A1 | 6/2006 | Fazan et al. | | |

OTHER PUBLICATIONS

Kaga, T., et al., "Crown-Shaped Stacked Capacitor Cell for 1.5-V Operation 64-Mb DRAMs", *IEEE Transactions on Electron Devices*, 38, (Feb., 1991),255-261.

Koyama, K., et al., "A Stacked Capacitor with (Ba/sub x/Sr/sub 1-x/)TiO/sub 3/ for 256M DRAM", *Technical Digest, International Electron Devices Meeting*, (Dec. 8-11, 1991),823-826.

Wolf, "Silicon Processing for the VLSI Era", *Process Integration*, vol. I,(1989),169-171.

* cited by examiner

METHOD FOR FORMING A STORAGE CELL CAPACITOR COMPATIBLE WITH HIGH DIELECTRIC CONSTANT MATERIALS

This is a Divisional of application Ser. No. 09/489,954, filed Jan. 24, 2000, now U. S. Pat. No. 6,791,131, which is a Divisional of application Ser. No. 08/572,392, filed Dec. 14, 1995, now U.S. Pat. No. 6,030,847, which is a Continuation-In-Part of application Ser. No. 08/390,336 filed on Feb. 17, 1995, now U.S. Pat. No. 5,478,772 which is a continuation of Ser. No. 08/044,331 filed on Apr. 2, 1993, now abandoned.

FIELD OF THE INVENTION

This invention pertains to semiconductor technology, and more particularly to storage cell capacitors for use in dynamic random access memories.

BACKGROUND OF THE INVENTION

As memory devices become more dense it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer to insulate the storage node electrode and cell plate electrode of the storage cell capacitor one from the other. A dielectric constant is a value characteristic of a material and is proportional to the amount of charge that can be stored in the material when it is interposed between two electrodes. $Ba_xSr_{(1-x)}TiO_3$ [BST], $BaTiO_3$, $SrTiO_3$, $PbTiO_3$, $Pb(Zr,Ti)O_3$ [PZT], (Pb,La) (Zr, $Ti)O_3$ [PLZT], (Pb,La) $TiO_3$ [PLT], $KNO_3$, and $LiNbO_3$ are among some of the high dielectric constant materials that can be used in this application. These materials have dielectric constant values above 50 and will likely replace the standard $Si_3N_4$, $SiO_2/Si_3N_4$, $Si_3N_4/SiO_2$, or $SiO_2/Si_3N_4/SiO_2$ composite films used in 256 kilobites (Kb) to 64 megabits (Mb) generations of DRAMs. $Si_3N_4$ and $SiO_2/Si_3N_4$ composite films have dielectric constant values of 7 or less. The storage node and cell plate electrodes are also referred to as first and second electrodes.

Unfortunately BST is incompatible with existing processes and can not be simply deposited on a polysilicon electrode as was the case for the lower dielectric constant materials, such as $Si_3N_4$ and $SiO_2/Si_3N_4$ composite layers. In the storage cell capacitor incorporating BST, described in the IDEM-91 article entitled, A STACKED CAPACITOR WITH $(Ba_xSr_{1-x}) TiO_3$ FOR 256M DRAM by Koyama et al., the storage node electrode typically comprises a layer of platinum overlying a tantalum layer which, in turn, overlies a polysilicon plug. Platinum is used as the upper portion of the first electrode since it will not oxidize during a BST deposition or subsequent anneal. An electrode that oxidizes would have a low dielectric constant film below the BST, thereby negating the advantages provided by the high dielectric constant material. The tantalum layer is introduced to avoid Si and Pt inter-diffusion and to prevent the formation of $SiO_2$ on top of the platinum surface. In addition, the platinum protects the top surface of the tantalum from strong oxidizing conditions during the BST deposition. FIG. 1 depicts the stacked storage node electrode comprising tantalum 1, platinum 2 (Ta/Pt) overlying the polysilicon plug 3.

However, the sidewalls 4 of the tantalum 1 formed during this process are subject to oxidation during the subsequent deposition of the BST layer. Since the tantalum 1 oxidizes the polysilicon plug 3 is also susceptible to oxidation. When portions of the polysilicon plug 3 and tantalum 1 are consumed by oxidation the capacitance of the storage cell capacitor is decreased since the storage node electrode is partially covered by a low dielectric constant film. Therefore the memory device cannot be made as dense. In addition, the storage node contact resistance increases drastically.

OBJECTS OF THE INVENTION

An object of the invention is to increase density of a memory device by increasing capacitance of storage cell capacitors. The storage cell capacitor of the invention features a storage node electrode having a barrier layer of tantalum or another material which experiences no oxidation during the formation of the storage cell capacitor. The barrier layer is interposed between a conductive plug and a non-oxidizing conductive material such as platinum. A dielectric layer, typically $Ba_xSr_{(1-x)} TiO_3$ [BST], is deposited on the non-oxidizing material. The barrier layer is surrounded on its sides by an insulative layer.

The insulative layer protects the barrier layer from oxidizing during the deposition and anneal of the BST thereby also eliminating oxidization of the conductive plug. By eliminating oxidization of the barrier layer and the conductive plug capacitance is maximized.

SUMMARY OF THE INVENTION

The invention is a storage node capacitor having a storage node electrode comprising a barrier layer interposed between a conductive plug and an oxidation resistant conductive layer and the method for fabricating the same. A thick insulative layer protects the sidewalls of the barrier layer during the deposition and anneal of a dielectric layer having a high dielectric constant.

The method comprises forming the conductive plug in a thick layer of insulative material such as oxide or oxide/nitride. The conductive plug is recessed from a planarized top surface of the thick insulative layer. The barrier layer is formed in the recess. The process is then continued with a formation of an oxidation resistant conductive layer and the patterning thereof to complete the formation of the storage node electrode.

Next a dielectric layer having a high dielectric constant is formed to overly the storage node electrode and a cell plate electrode is then fabricated to overly the dielectric layer.

Since the barrier layer is protected during the formation of the dielectric layer by both the oxidation resistant conductive layer and the thick insulative layer there is no oxidation of the barrier layer or the contact plug thereby maximizing capacitance of the storage node and reducing high contact resistance issues.

The invention includes a storage node capacitor having a storage node electrode comprising a barrier layer interposed between a conductive plug and an oxidation resistant conductive layer and the method for fabricating the same. A thick insulative layer protects the sidewall of the barrier layer during the deposition and anneal of a dielectric layer having a high dielectric constant.

In one preferred implementation the method comprises forming the conductive plug in a thick layer of insulative material such as oxide or oxide/nitride. The conductive plug is recessed from a planarized top surface of the thick insulative layer. The barrier layer and the oxidation resistant layer are formed in the recess. A portion of the thick insulative material is removed to expose portions of the oxidation resistant layer. Remaining portions of the thick insulative material continue to encompass the barrier layer.

Next a dielectric layer having a relatively high dielectric constant is formed to overlie the storage node electrode and a cell plate electrode is then fabricated to overlie the dielectric layer. In this preferred implementation, since the barrier layer is protected during the formation of the dielectric layer by both the oxidation resistant conductive layer and the thick insulative layer there is little or no oxidation of the barrier layer or the contact plug, thereby maximizing capacitance of the storage node and reducing high contact resistance issues.

In one particular preferred embodiment, the barrier layer is tantalum or another material which experiences no oxidation during the formation of the storage cell capacitor. The oxidation resistant conductive layer is preferably a non-oxidizing conductive material such as platinum. The dielectric layer is preferably $Ba_xSr_{(1-x)}TiO_3$ [BST].

The insulative layer and the oxidation resistant layer protect the barrier layer from oxidizing during the deposition and anneal of the BST thereby also eliminating oxidization of the conductive plug. By minimizing or eliminating oxidization of the barrier layer and the conductive plug capacitance is maximized.

BRIEF DESCRIPTION OF THE DRAWINGS

FIGS. 2–11 are cross-sectional views of a portion of a partially processed semiconductor wafer depicting the steps of the invention for fabricating a storage cell capacitor.

FIG. 2 depicts field-effect transistors overlying a silicon substrate and wordlines overlying field oxide.

FIG. 3 is the wafer portion of FIG. 2 following the deposit of an undoped thick oxide layer and planarization thereof.

FIG. 4 is the wafer portion of FIG. 3 following the masking and subsequent etching of the deposited oxide layer to form self-aligned openings.

FIG. 5 is the wafer portion of FIG. 4 following the formation of polysilicon plugs in the openings and the removal of the mask shown in FIG. 4.

FIG. 6 is the wafer portion of FIG. 5 following the recessing of the polysilicon plug in the thick oxide layer.

DETAILED DESCRIPTION OF THE PREFERRED EMBODIMENT

The method for fabricating the storage cell capacitor of the invention is shown pictorially in FIGS. 2–11.

Figure 1:
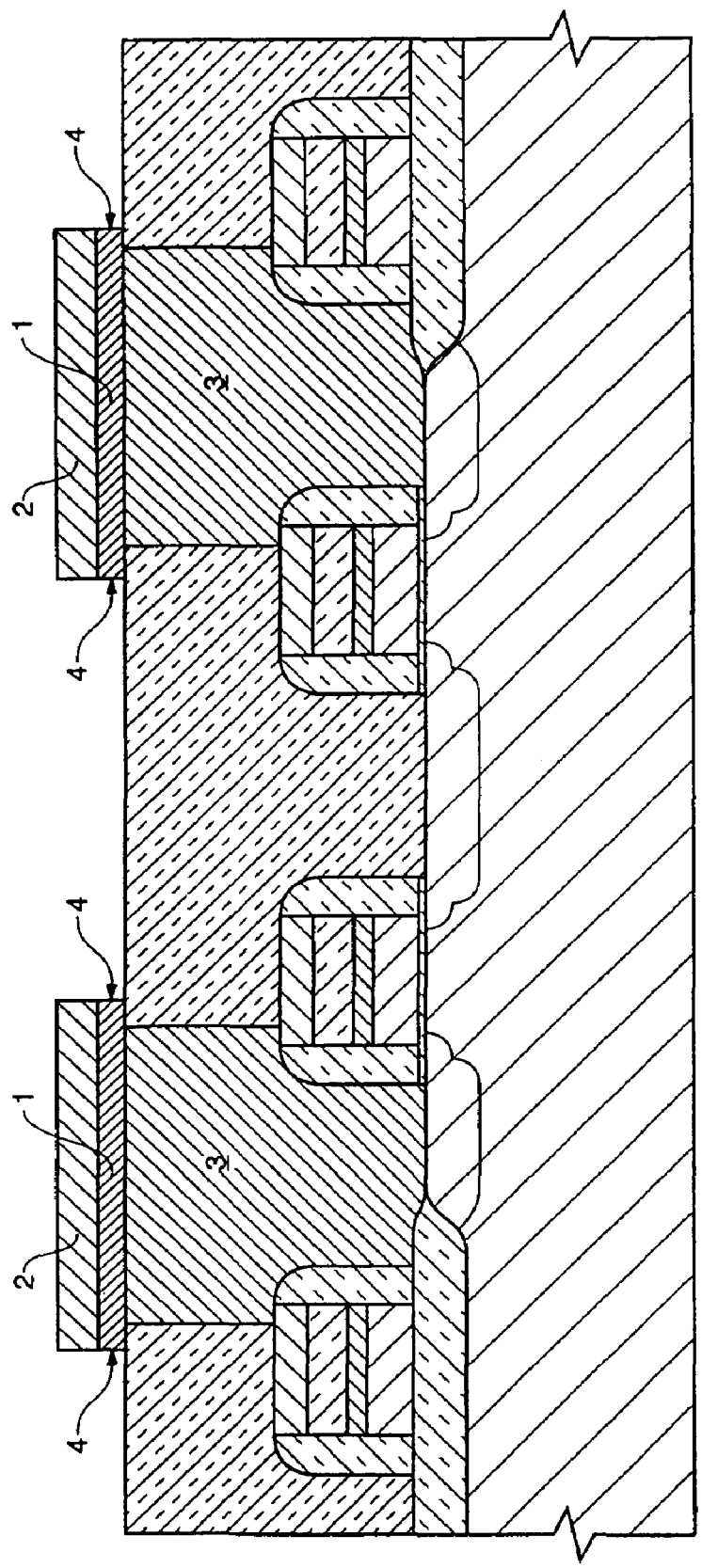
FIG. 1 is a cross-sectional view of a portion of a partially processed semiconductor wafer of the related art.
Figure 2:
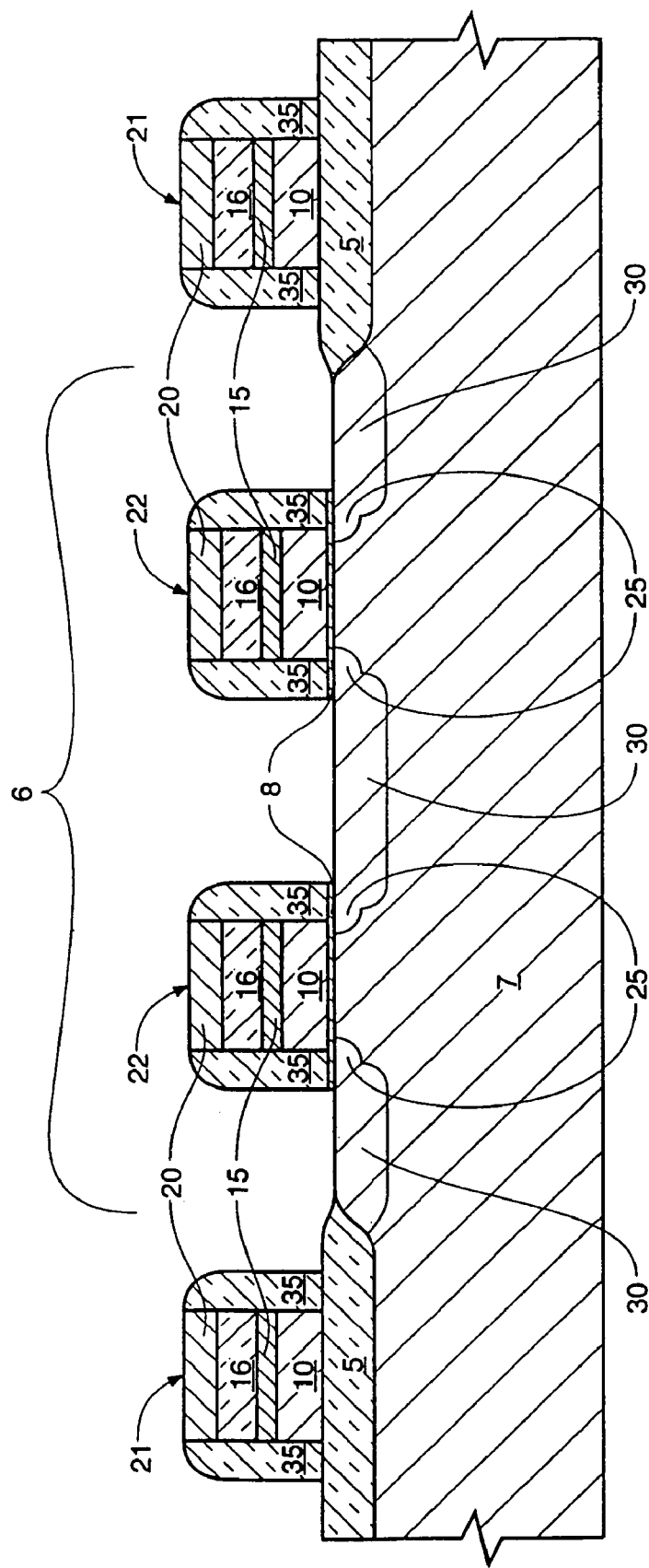

Referring to FIG. 2, a cross-sectional view of an in-process dynamic random access memory (DRAM) cell is shown following conventional local oxidation of silicon (LOCOS) or special LOCOS processing which creates substantially planar field oxide regions 5 (created using modified LOCOS or trench isolation processes) and future active areas 6 (those regions of the substrate not covered by field oxide) on a silicon substrate 7. The creation of the field oxide is preceded or followed by a thermally grown dielectric layer 8 of silicon oxide. The depicted cell is one of many cells that are fabricated simultaneously and comprise a memory array. Following the creation of the field oxide region 5 and dielectric layer 8 a first conductively doped polysilicon layer 10, a metal silicide layer ($Wsi_x$) 15, an oxide layer 16, and a thick nitride layer 20 are deposited. The thick nitride layer 20 will function as an etch stop during the storage node buried contact etch, thus allowing self-alignment if desired. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 8. The lightly-doped regions 25 are created utilizing a phosphorus or arsenic implant. Deposition, densification and a reactive ion etch (RIE) of a silicon-nitride spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

The formation of the FETs 22 and wordlines 21 as described are exemplary of one application to be used in conjunction with the present embodiment of the invention. Other methods of fabrication and other applications are also feasible and perhaps equally viable.

Figure 3:
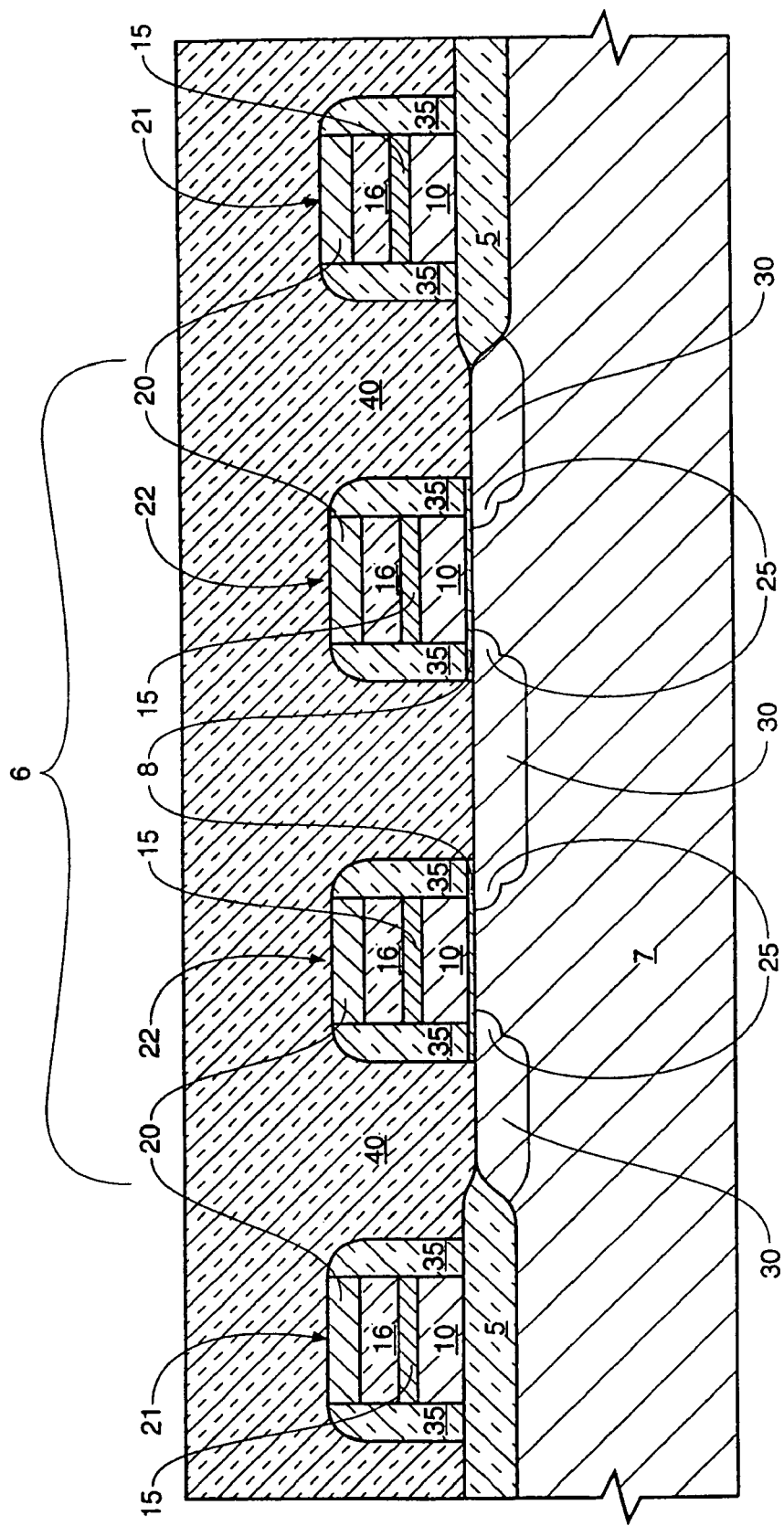

In FIG. 3 a thick insulative conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide is planarized, preferably chemical mechanically planarized (CMP), in order to provide a uniform height. Optionally nitride, oxynitride or another suitable material may be deposited as the insulative layer.

At this juncture buried digit lines may be fabricated as described in U.S. Pat. No. 5,168,073 herein incorporated by reference. In the case where the buried digit lines are formed by the method described in U.S. Pat. No. 5,168,073 the oxide 40 is deposited in two steps, one deposit prior to the digit line formation and one deposit subsequent to the digit line formation. In this case, an initial thick oxide layer is deposited and planarized and then overlaid with a relatively thick $Si_3N_4$ layer. The $Si_3N_4$ layer is then planarized. When the thick insulative layer is comprised only of oxide it is possible for oxygen to diffuse through the oxide. By overlying the oxide with $Si_3N_4$ it is possible to prohibit oxygen diffusion though the oxide.

Figure 4:
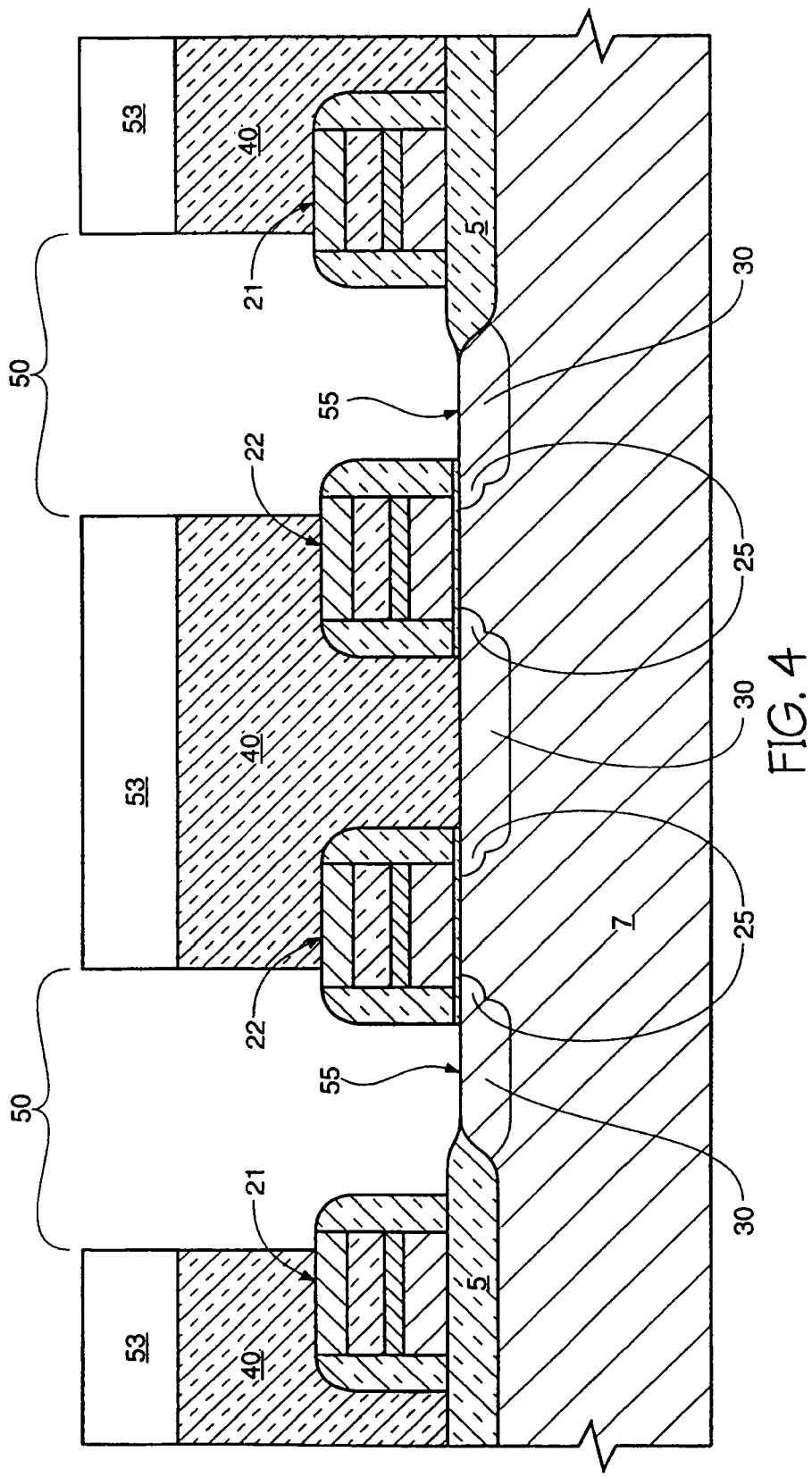

Referring to FIG. 4, mask 53 defines self-aligned substrate contact area 55. The oxide 40 is etched to form a self-aligned openings 50 exposing the contact areas 55 of the substrate 7.

Figure 5:
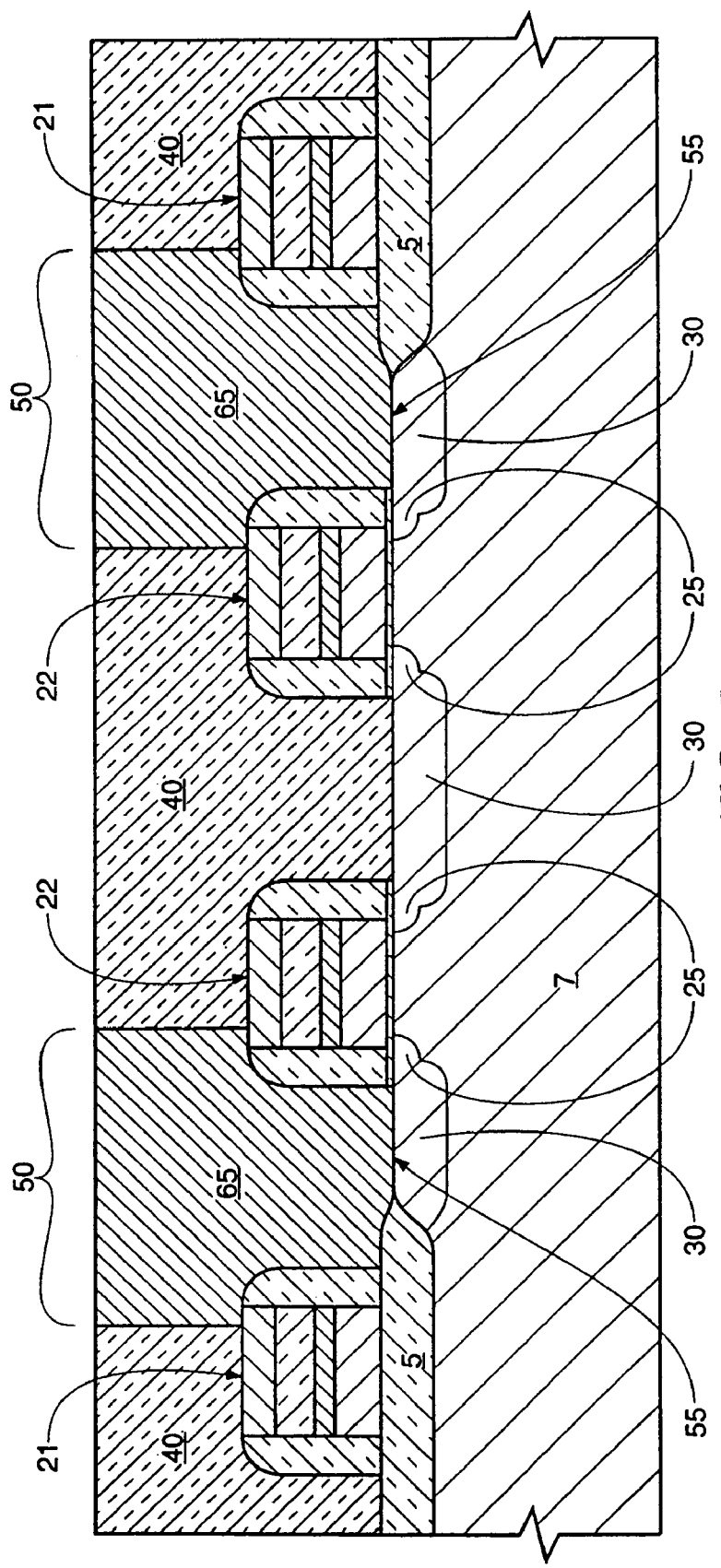

Referring to FIG. 5, in order to provide electrical communication between the substrate 7 and the storage cell capacitor a polysilicon plug 65 is formed in each opening 50. The actual method used to form the polysilicon plugs 65 is not critical, two options being a selective silicon growth from the contact area 55 or a doped polysilicon deposition and subsequent etch back or CMP back.

Figure 6:
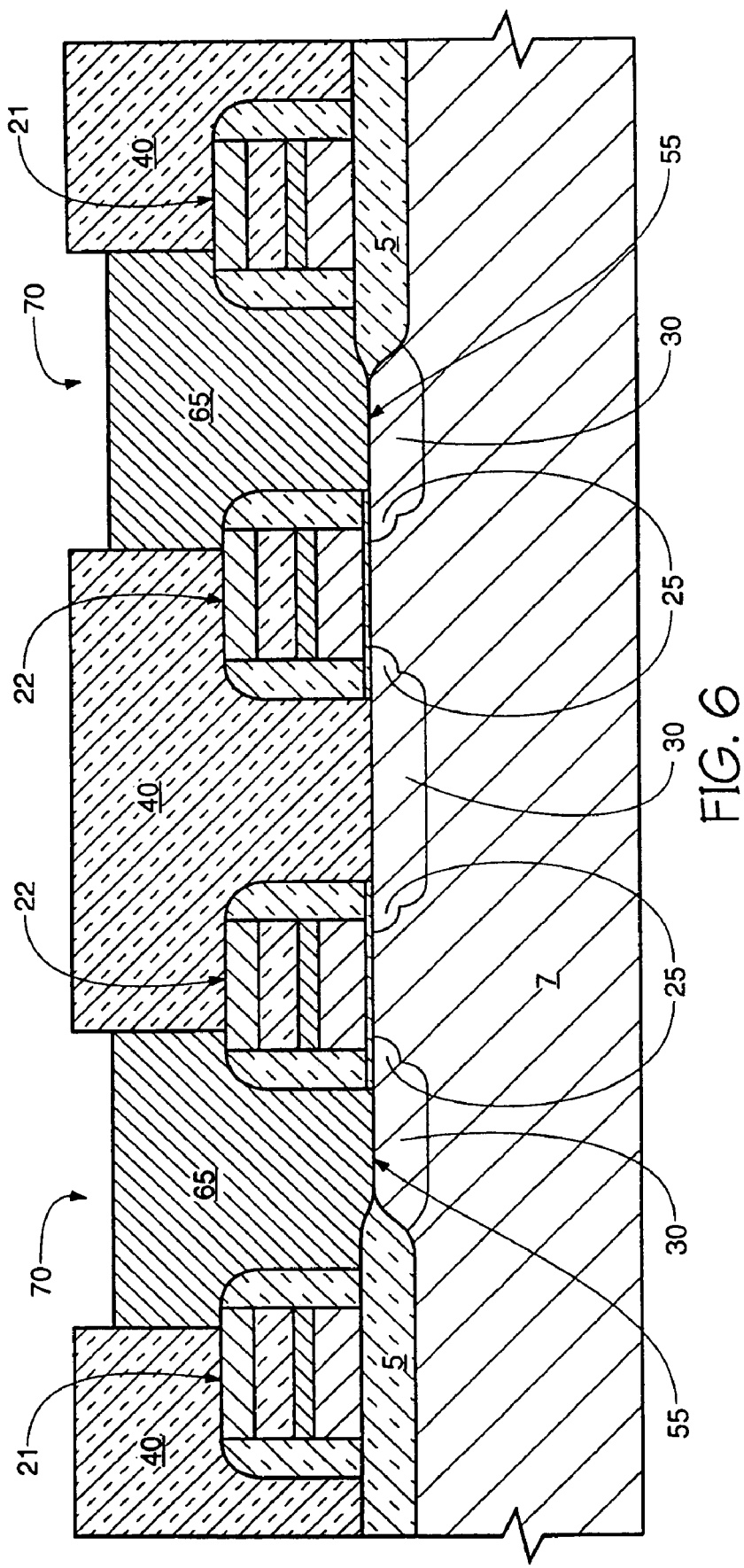

Referring now to FIG. 6, an upper portion of the polysilicon plugs 65 is removed during a dry etch in order to form a recesses 70, Typically, this etch back is 50 to 400 nano meters (nm). In a case where the polysilicon plugs 65 are formed during a selective silicon growth it is possible to form the recess 70 by controlling the growth.

Figure 7A:
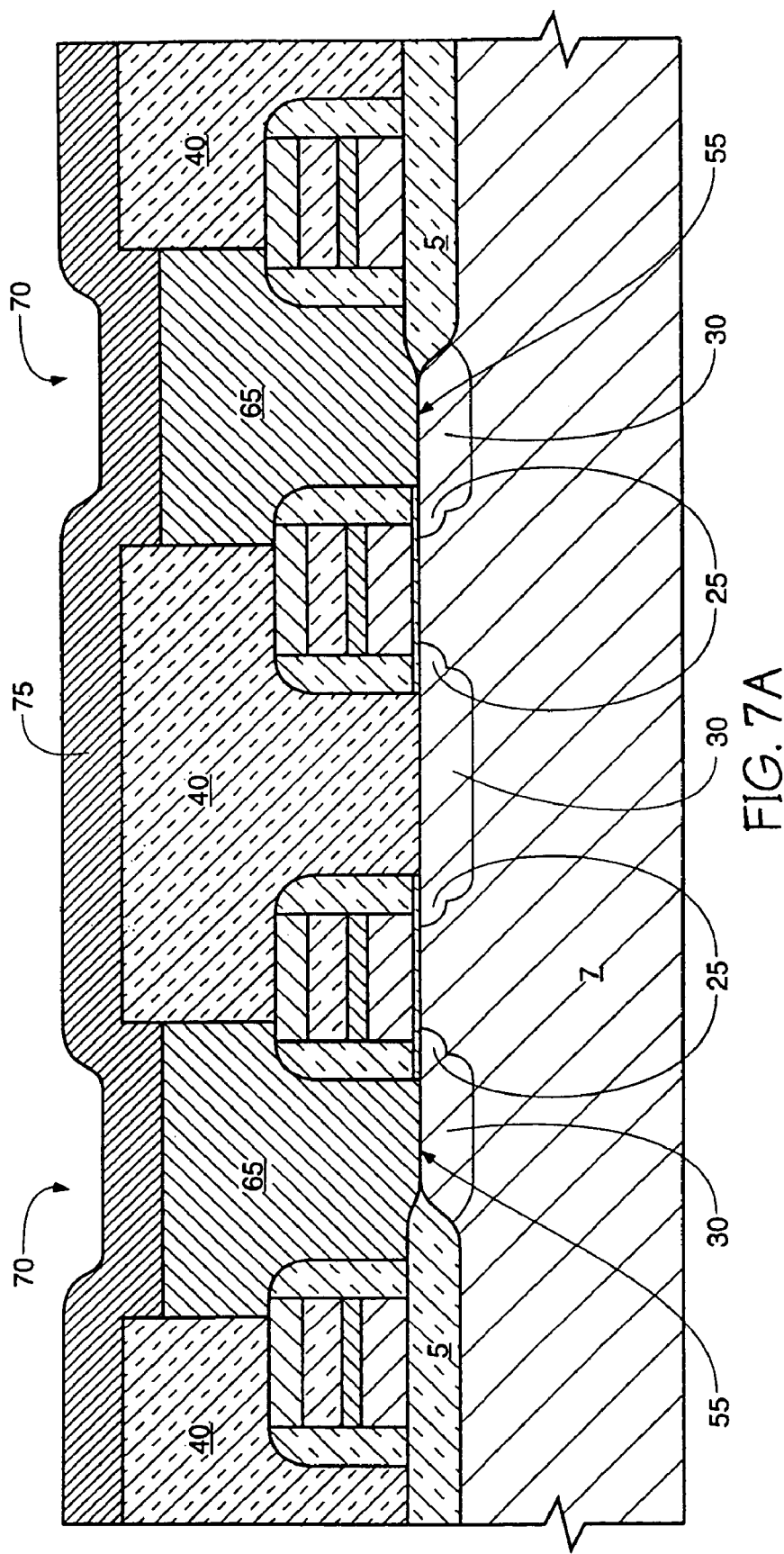
FIGS. 7a and 7b are wafer portions of FIG. 6 following the deposition of a tantalum layer.
Figure 7B:
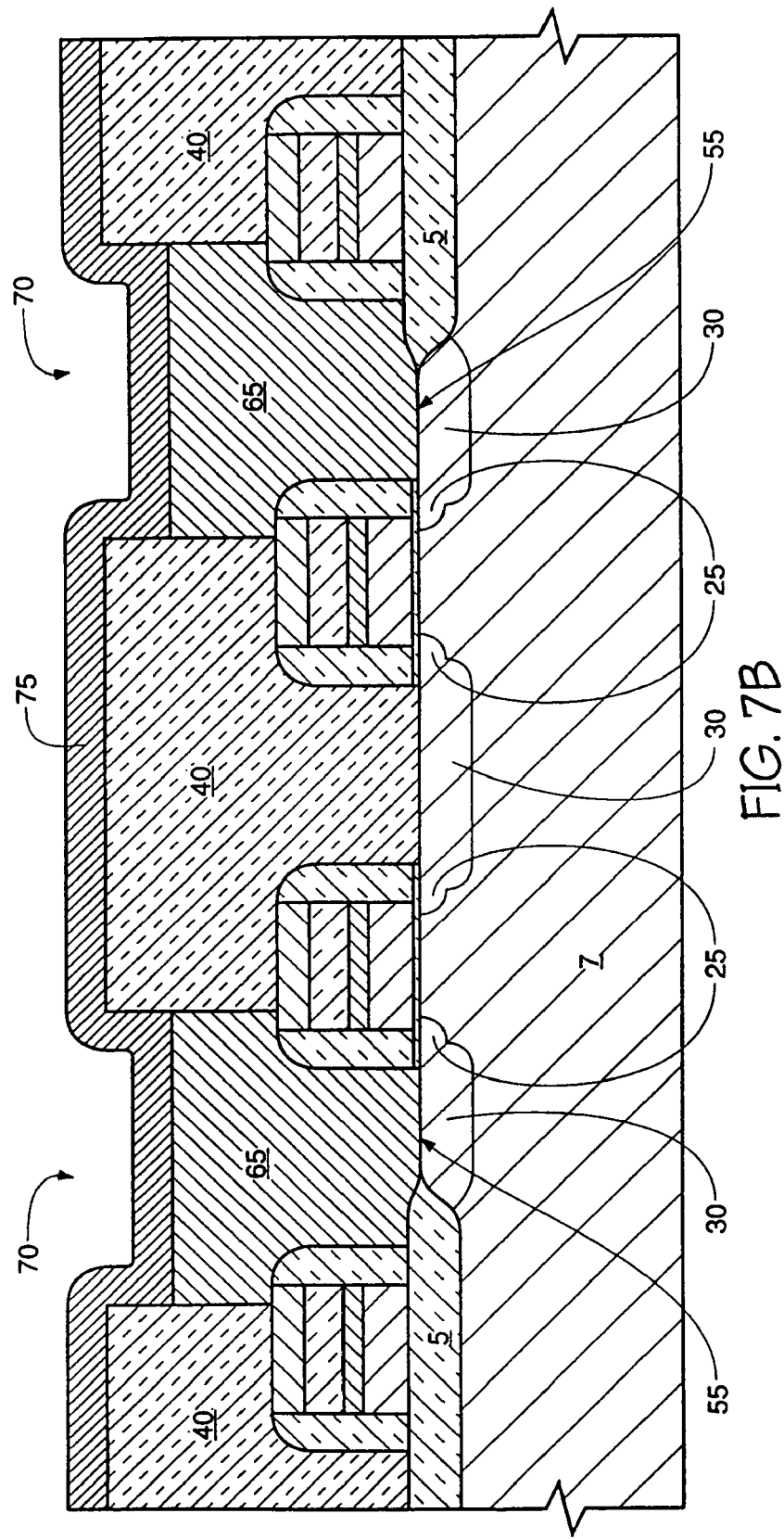

Referring to FIG. 7a, a tantalum layer 75, with a thickness larger than the depth of the recesses 70, is formed by a chemical vapor deposition (CVD) or a sputtering process performed at room temperature. The tantalum layer 75 provides a barrier against silicon diffusion, of the polysilicon plug during subsequent high temperature anneals and other materials capable of prohibiting silicon diffusion may be used in place of tantalum. For example, titanium and titanium nitride may be used as well as other materials. Alternately, a tantalum layer 75 may be formed wherein the thickness is less than or equal to the depth of the recess. FIG. 7b depicts the latter case. In this particular case the storage cell capacitor gains more vertical area thereby increasing capacitance.

Figure 8A:
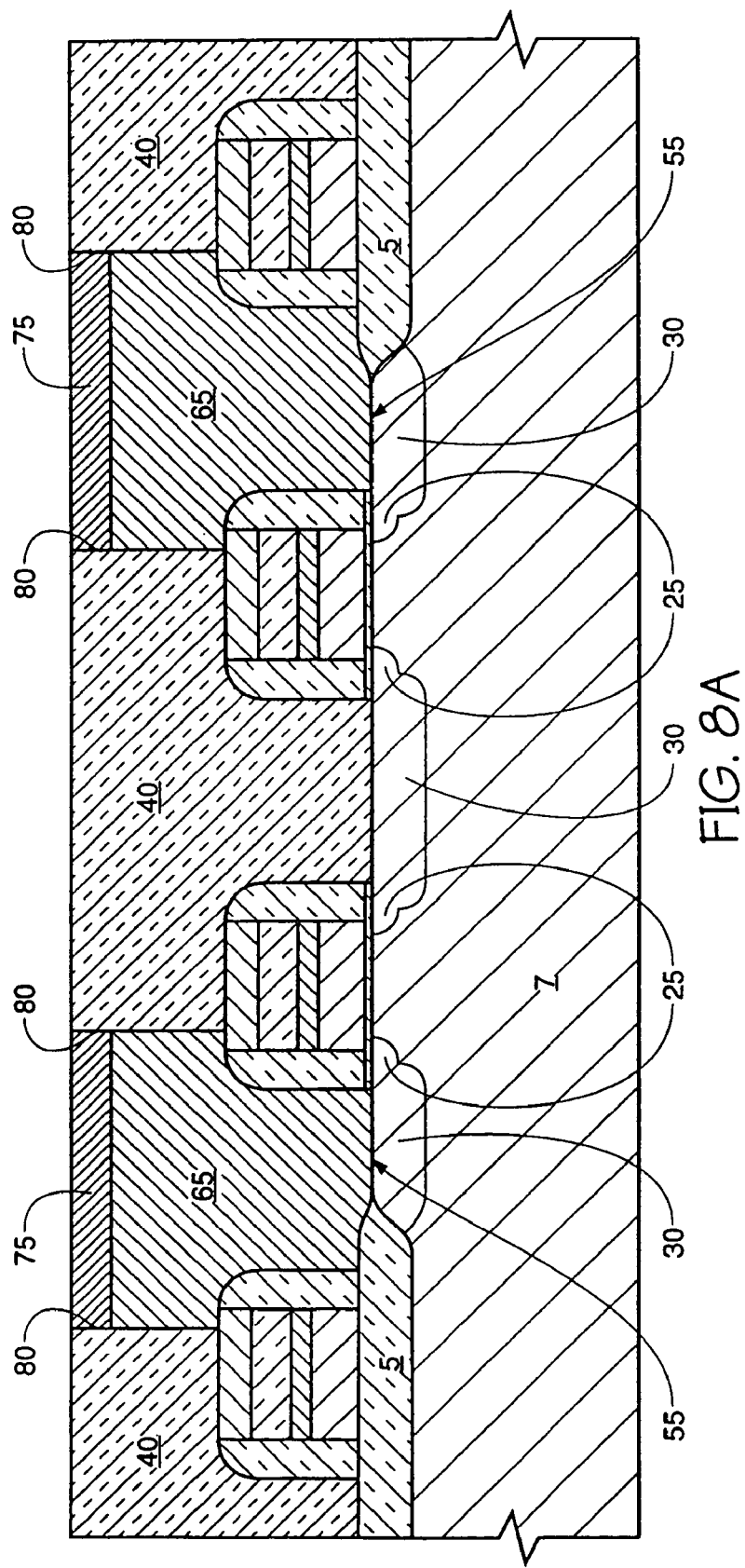
FIGS. 8a and 8b are wafer portions of FIGS. 7a and 7b following the planarization of the tantalum layer.
Figure 8B:
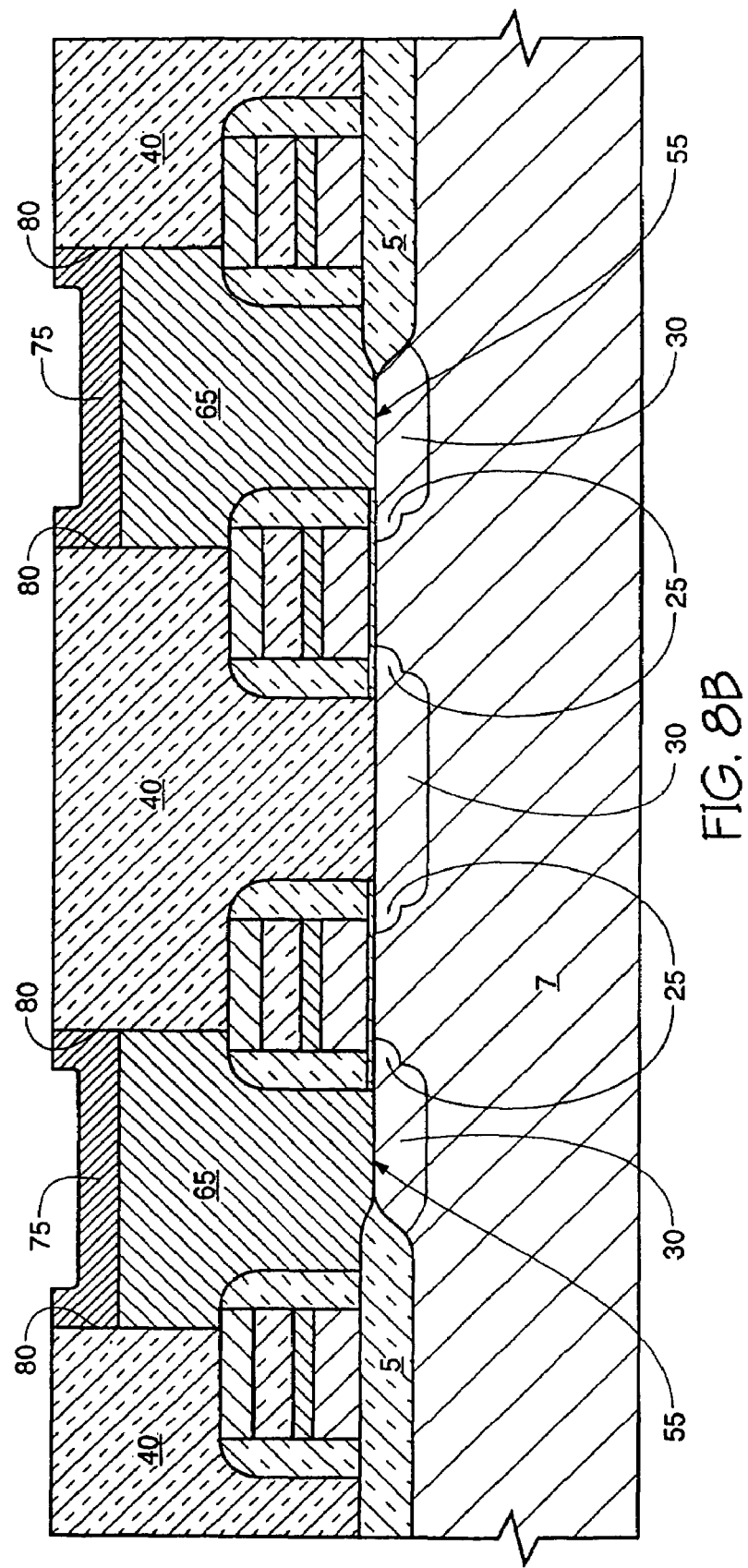

Referring to FIGS. 8a and 8b, the tantalum layer 75 of FIGS. 7a and 7b, respectively, is planarized, preferably by CMP, in order to expose at least the oxide layer 40 and in order to retain tantalum 75 in recesses 70 overlying the polysilicon plugs 65. Portions of the oxide layer 40 may be planarized during this step. It is important, of course to retain a sufficient depth of tantalum 75 in order to inhibit silicon diffusion of the polysilicon plugs 65. It can be seen that only the upper surface of the tantalum layer 75 is exposed and that the tantalum sidewalls 80 are protected by the oxide layer 40.

Figure 9A:
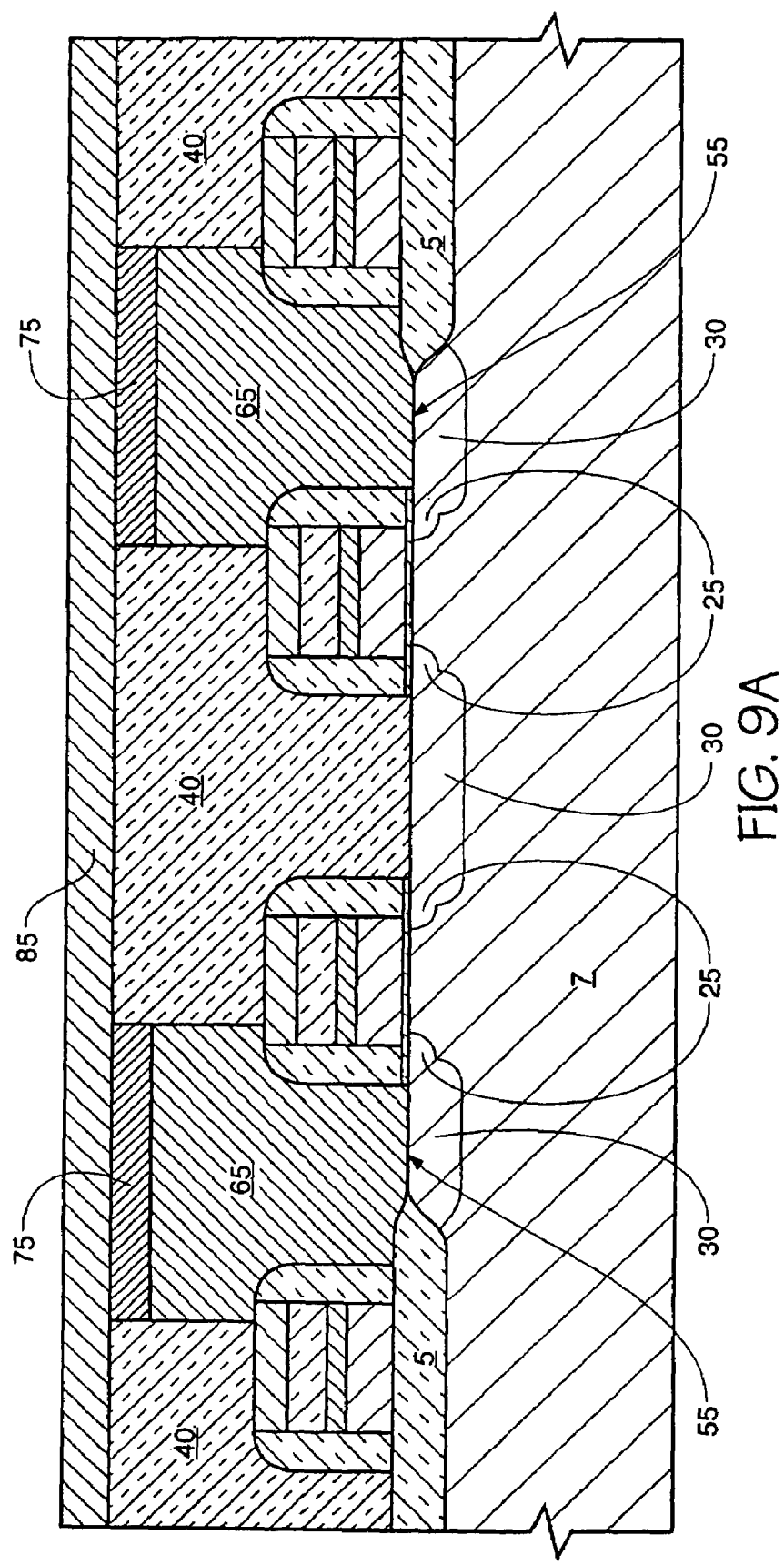
FIGS. 9a and 9b are wafer portions of FIGS. 8a and 8b following the deposition of a platinum layer.
Figure 9B:
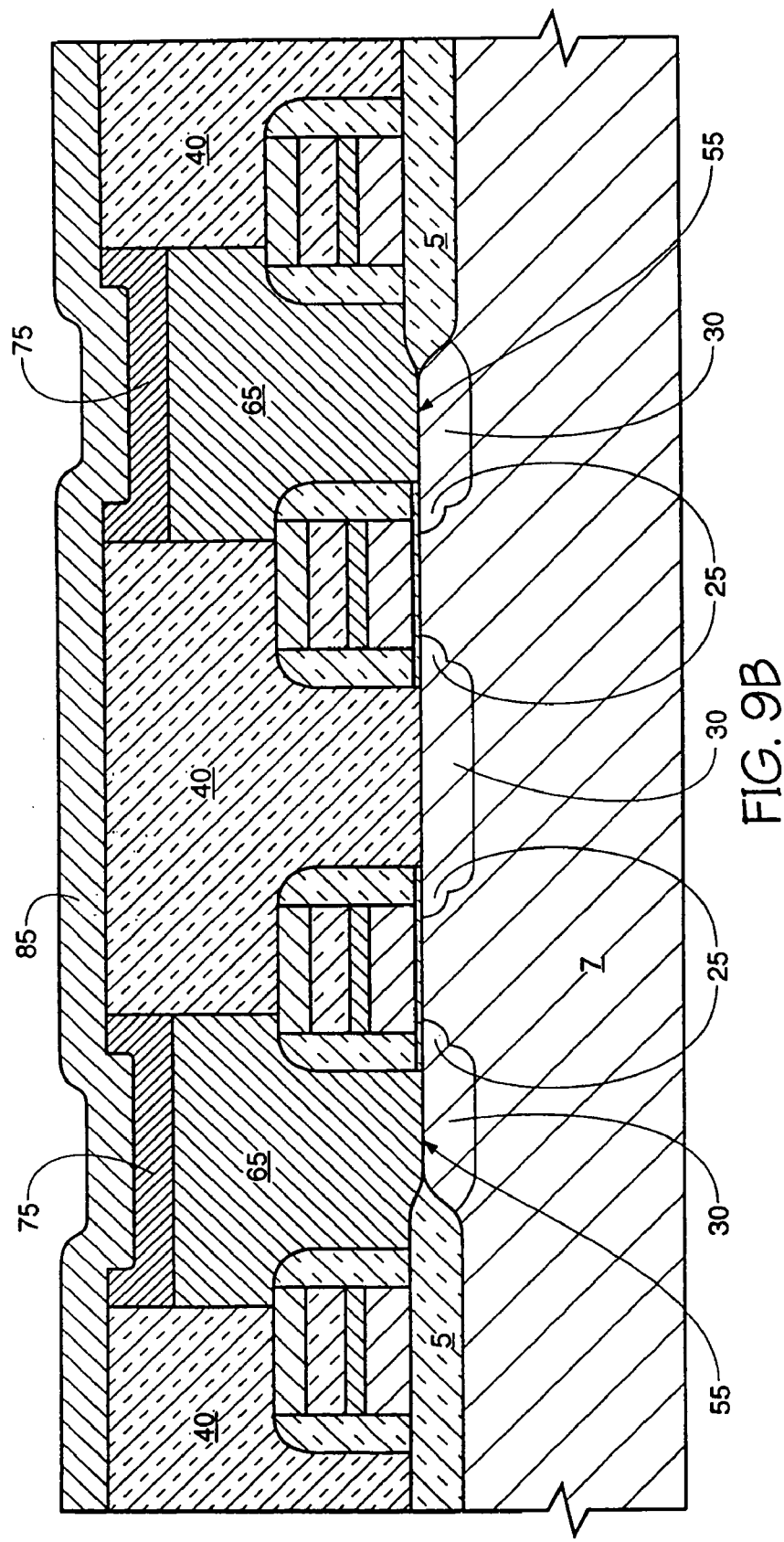

Referring to FIGS. 9a and 9b a platinum layer 85 is formed by CVD or a sputtering technique. The platinum layer 85 overlies the tantalum layer 75 shown in FIGS. 8a and 8b, respectively. Since the platinum layer 85 is resistant to oxidation it provides an excellent surface for the deposition of the high dielectric constant material. Other materials which are resistant to oxidation may be used in place of the platinum. For example, $RuO2$ and TiN, as well as other non-oxidizing materials may be used. Since the tantalum layer is recessed below the oxide layer 40, a thick layer of platinum may be deposited without decreasing the density of the device. By using very thick platinum electrodes, the capacitance area is increased by the sidewall area contribution. Therefore, the platinum is deposited from at least a thickness of 50 nm to a thickness of 1 micro meter($\mu$m)

Figure 10A:
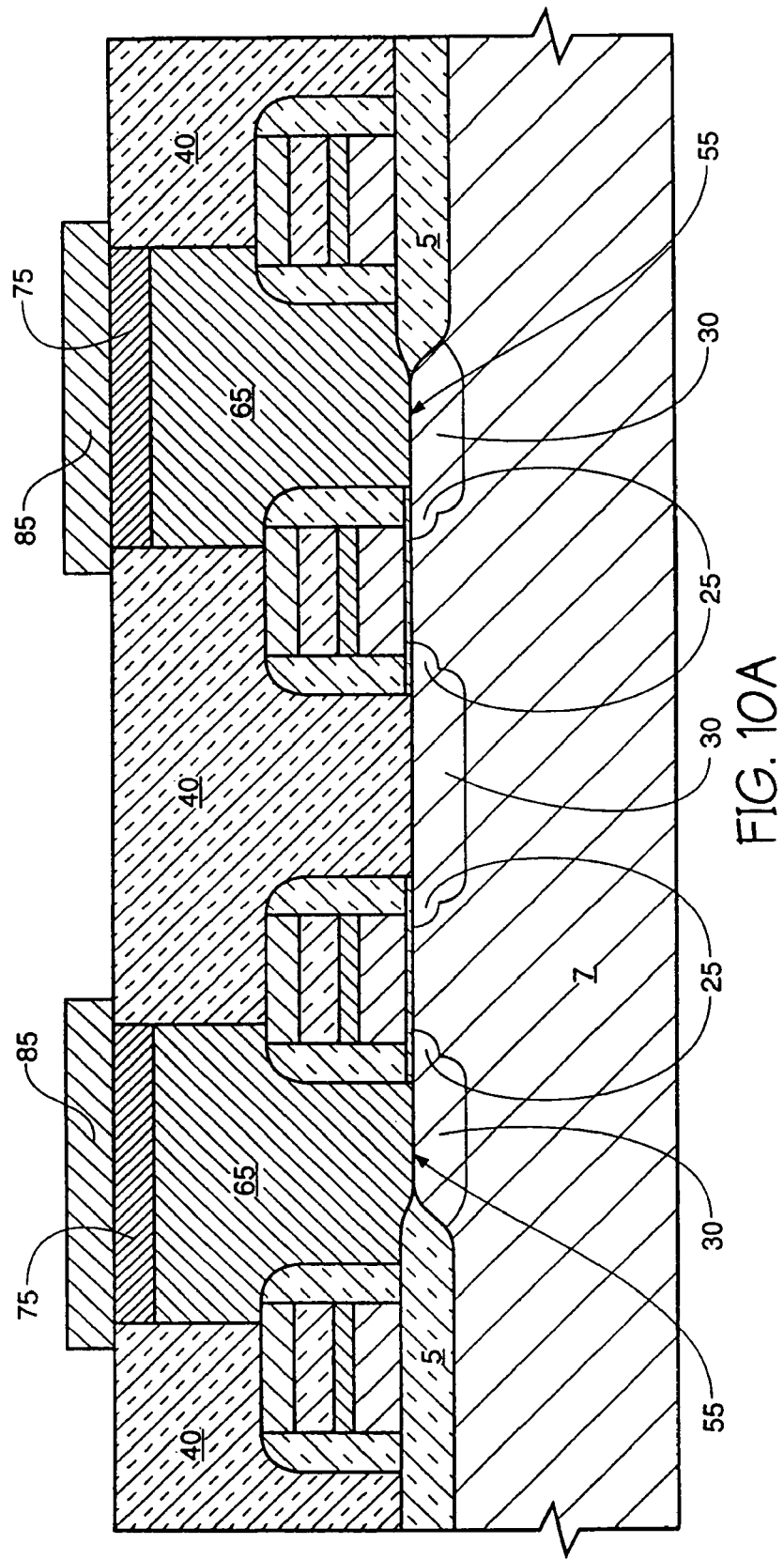
FIGS. 10a and 10b are the wafer portions of FIGS. 9a and 9b following the etching of the platinum layer to complete the formation of the storage node.
Figure 10B:
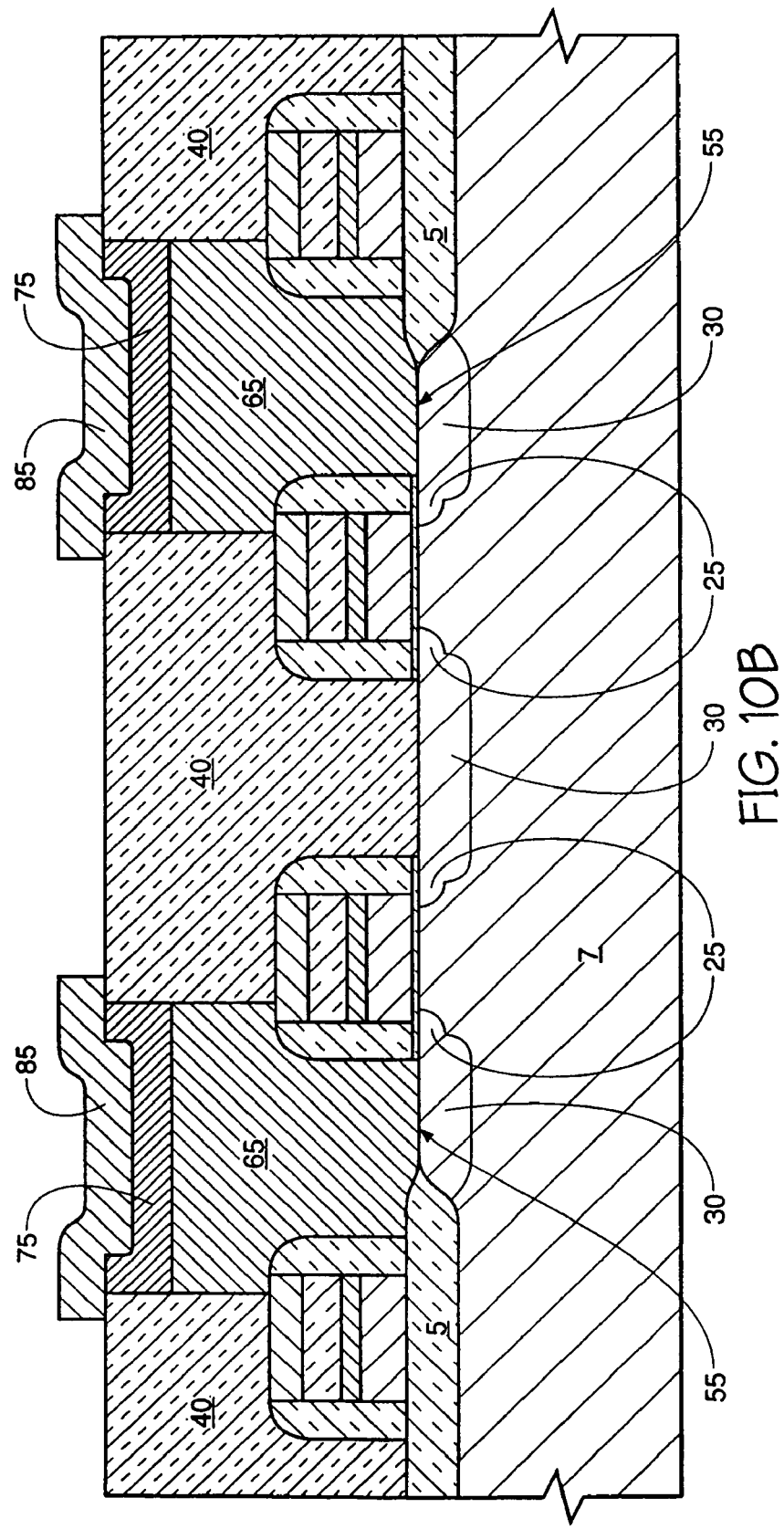

FIGS. 10a and 10b depict the structure following the masking of the platinum layer 85 overlying the tantalum and the removal of unmasked portions of the platinum layer 85 to form the completed storage node electrode of the storage cell capacitor. Typically the storage node electrode is thought of as comprising the tantalum layer 75 and the platinum layer 85. The polysilicon plug 65 is often thought of as an electrical interconnect interposed between the substrate and the storage node electrode, although it can be thought of as a portion of the storage node itself.

Figure 11A:
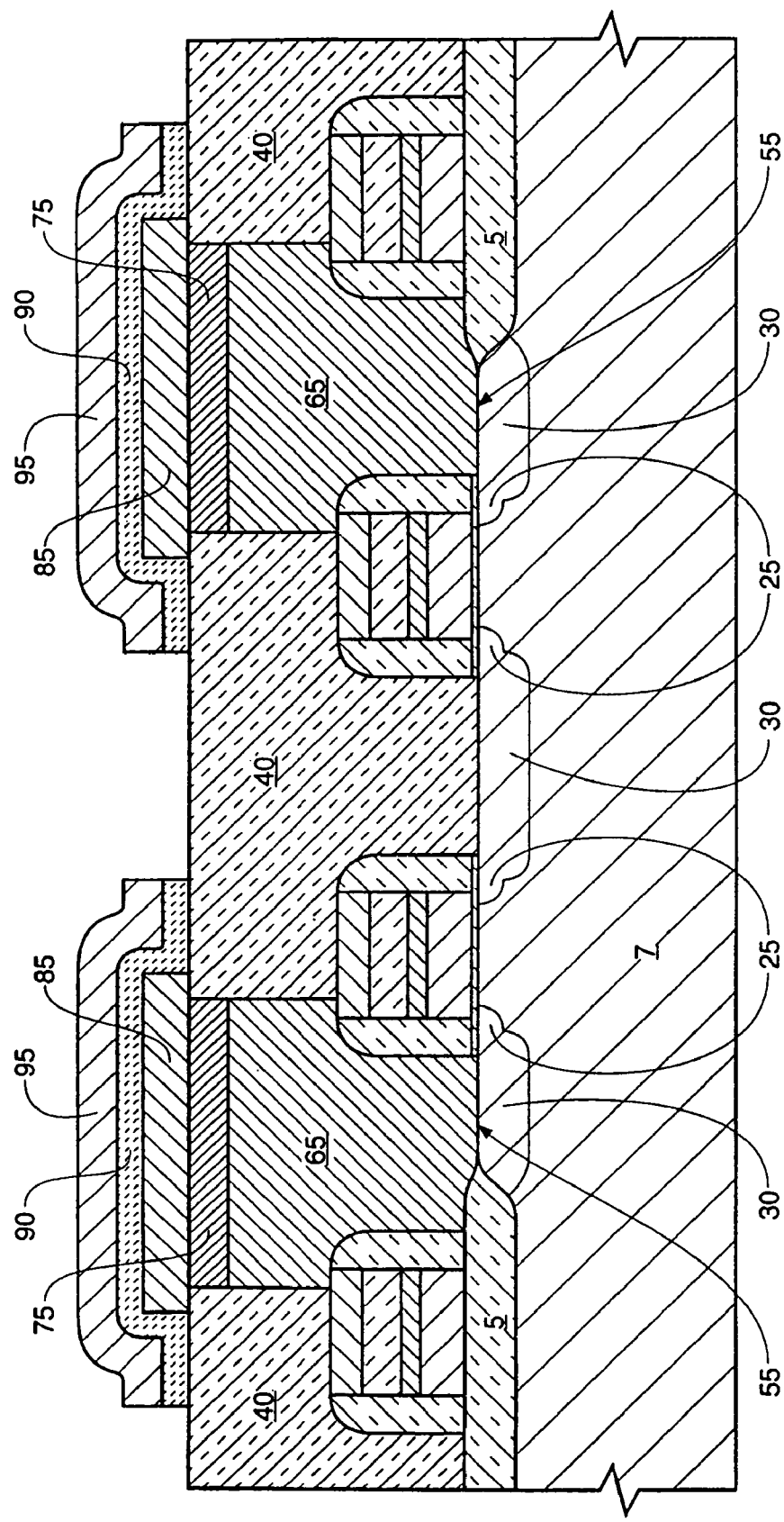
FIGS. 11a and 11b are wafer portions of FIGS. 10a and 10b following the deposition of a BST dielectric layer and a cell plate layer and patterning of these layers to complete the formation of the storage cell capacitor.
Figure 11B:
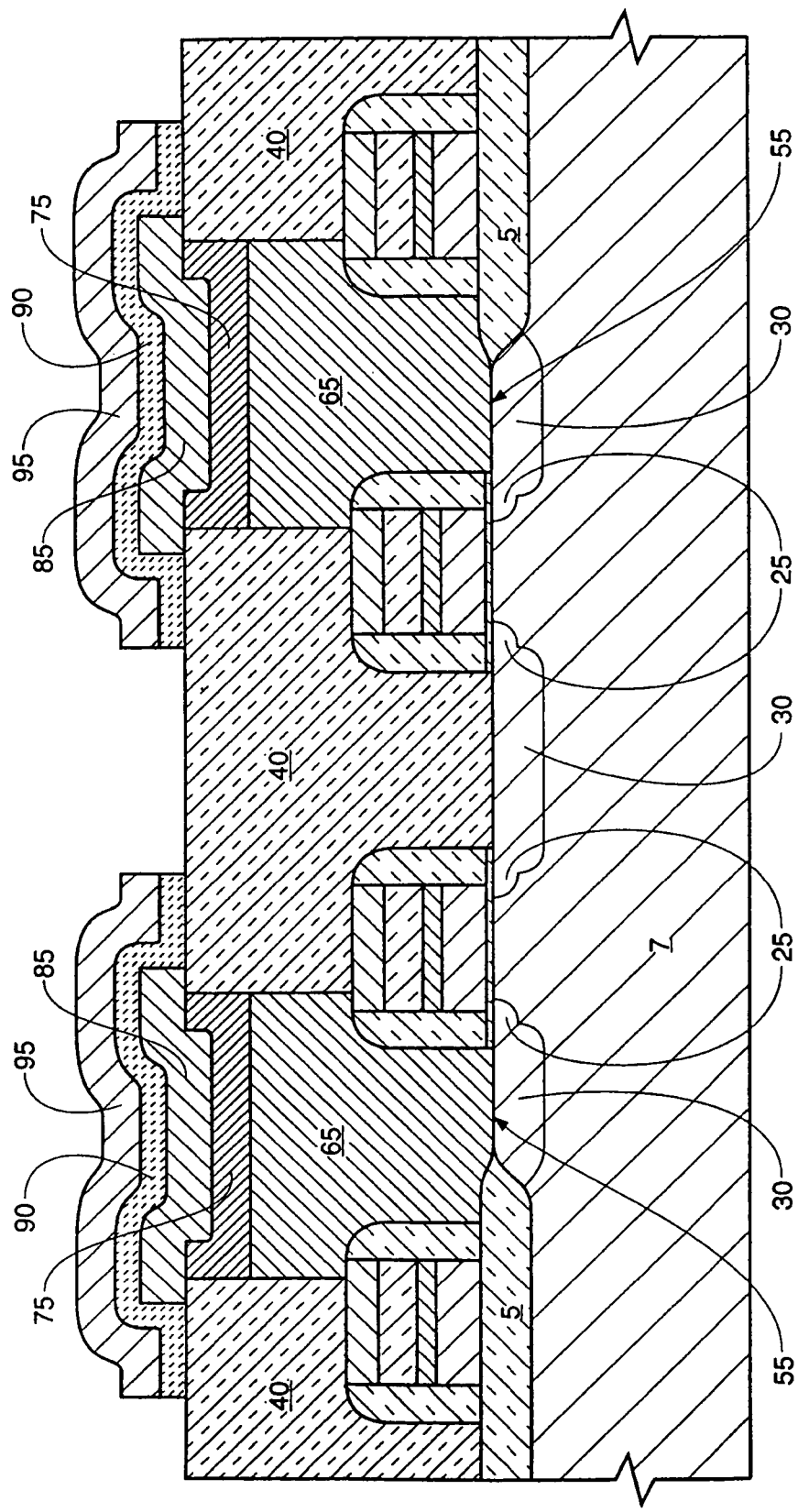

FIGS. 11a and 11b depict the storage cell capacitor following a deposition and anneal of a dielectric layer 90 overlying the platinum layer 85 of FIGS. 10a and 10b, respectively. The dielectric layer is typified as having a high dielectric constant. The storage cell capacitor fabrication is completed with the sputter or CVD of a 50 to 200 nm thick cell plate layer 95 to form a cell plate electrode. The cell plate layer 95 is typically Platinum, TiN or some other conductive material.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In the applicant's invention BST is the preferred material and is deposited at a thickness range of 30 nm–300 nm by RF-magnetron sputtering or CVD. The tantalum layer 75 is not oxidized during the application of a high temperature anneal due to the fact that it is protected on its sidewalls 80 by the oxide layer 40 and that it is protected on its upper surface by the platinum layer 85, see FIG. 11. Therefore even after the formation of the dielectric layer the recess retains the original tantalum 75 formed therein and capacitance is not sacrificed as it would be when portions of the tantalum 75 are consumed by oxidation. Therefore capacitance is effectively increased over methods where portions of tantalum are oxidized.

The process can be continued or modified to accommodate the steps described in U.S. Pat. No. 5,168,073, previously incorporated by reference, for providing electrical interconnection between a plurality of capacitors thus formed.

By utilizing the method of the preferred embodiments of the invention, a high density memory device is provided featuring a stacked capacitor formed in a compact area as a result of a dielectric layer having a high dielectric constant and retention of storage node integrity during an anneal of the dielectric layer and the capability of depositing a very thick platinum layer as a portion of the first electrode.

Although a process and an alternate process have been described for forming the storage cell capacitor it is apparent the process is equally applicable for the fabrication of other types of capacitors used in integrated circuits. It should also be apparent to one skilled in the art that changes and modifications, such as deposition depths, may be made thereto without departing from the spirit and scope of the invention as claimed.

In the crown embodiment of the invention the initial formation of the capacitor is accomplished according to the steps depicted in FIGS. 2–5 and described in reference to FIGS. 2–5. The process continues with steps 12–19. Layers corresponding to similar layers of the previous embodiments shall be numbered the same.

Figure 12:
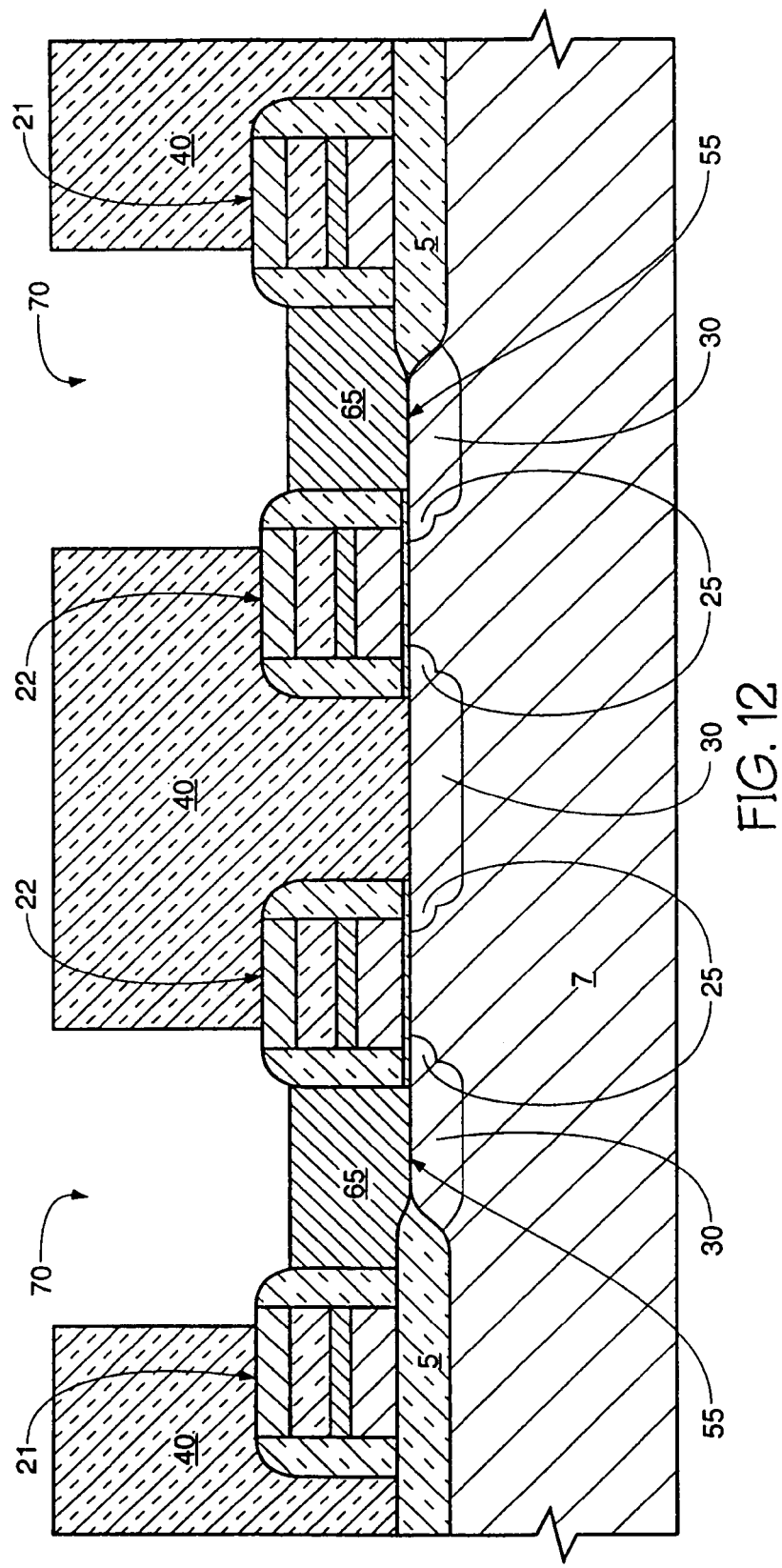
FIG. 12 is the cross sectional view of FIG. 5 following the formation of a recess in the oxide layer.

Referring now to FIG. 12, an upper portion of each polysilicon plug 65 is removed during a dry etch in order to form recesses 70. Typically, this etch back is 50 to 400 nano meters (nm). In a case where the polysilicon plugs 65 are formed during a selective silicon growth it is possible to form the recess 70 by controlling the growth.

Figure 13:
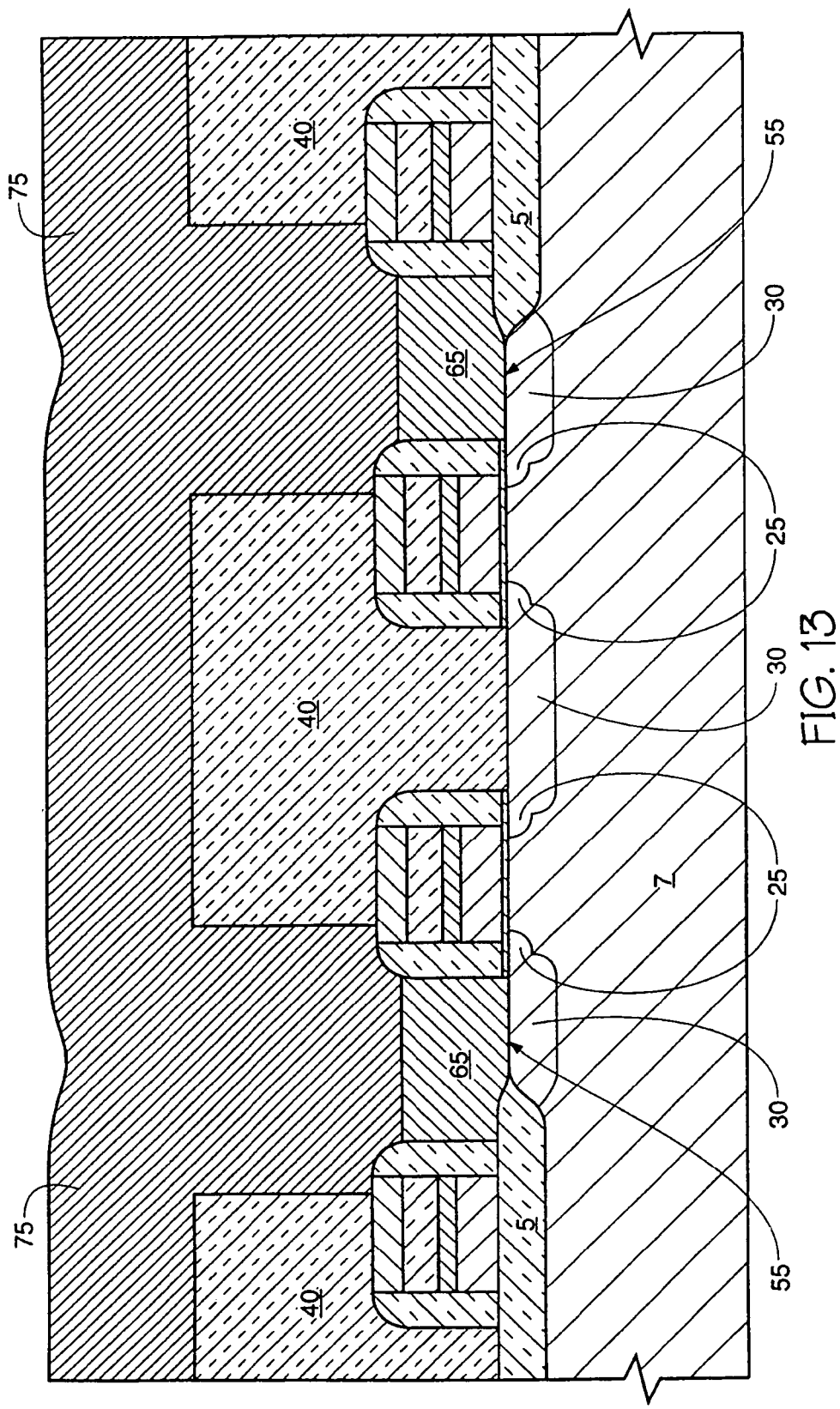
FIG. 13 is the cross sectional view of FIG. 12 following the deposition of a barrier layer.

Referring to FIG. 13, a tantalum layer 75 is formed by a chemical vapor deposition (CVD) or a sputtering process, which may be performed at room temperature. The tantalum layer 75 provides a barrier against silicon diffusion of the polysilicon plug during subsequent high temperature anneals. Other materials capable of prohibiting silicon diffusion may be used in place of tantalum such as, for example: titanium nitride, TaN, Ti, $RuO_2$, and Ru.

Figure 14:
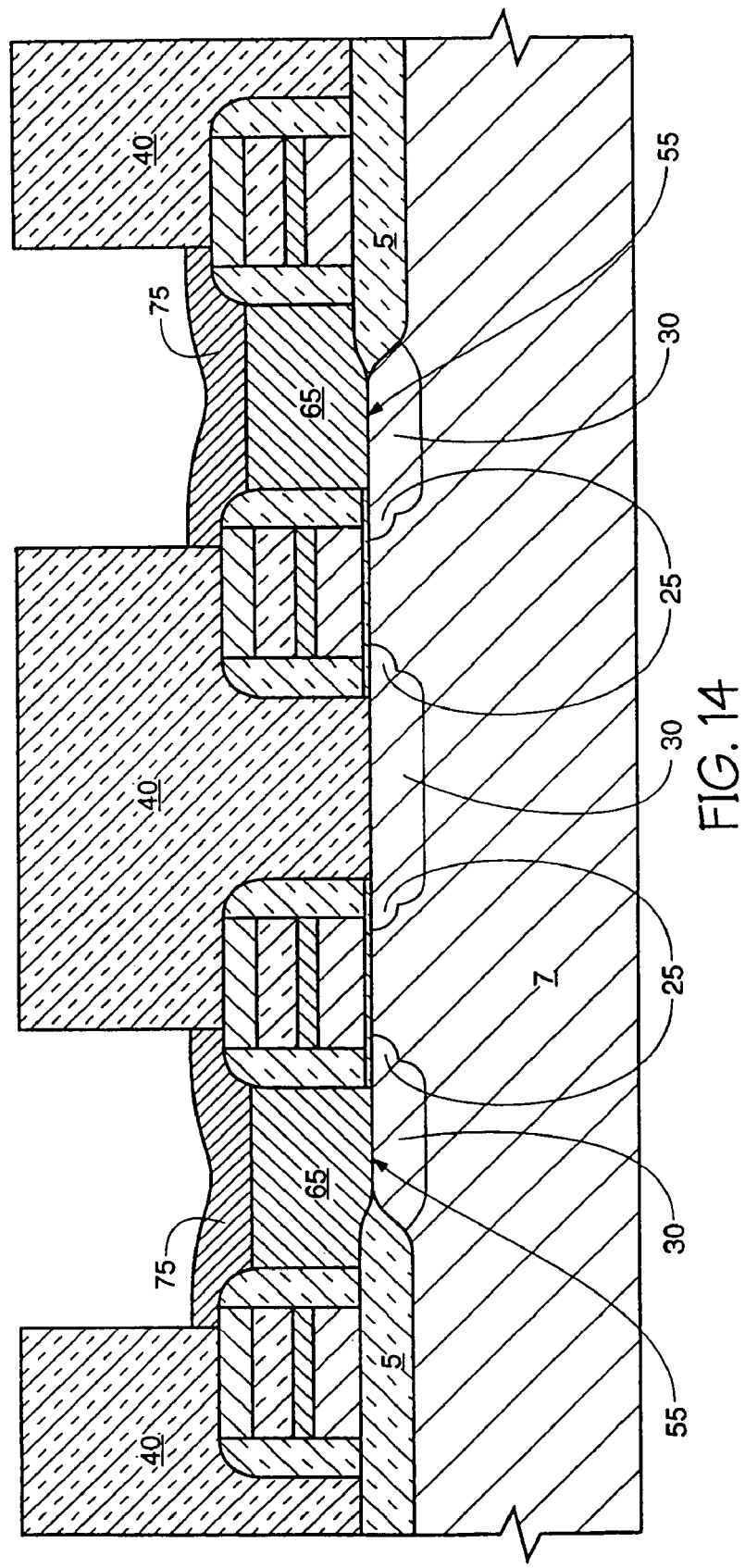
FIG. 14 is the cross sectional view of FIG. 13 following an etch back of the barrier layer.

Referring to FIG. 14, the tantalum layer 75 shown in FIG. 7 is etched back in order to expose the oxide layer 40 and in order to retain tantalum 75 in recesses 70 overlying the polysilicon plugs 65. The tantalum layer 75 should be recessed below a top surface of the exposed oxide layer 40. The etch back may be preceded by a planarization to remove the tantalum overlying the oxide layer 40. Portions of the oxide layer 40 may be planarized during this step. The thickness of the initial tantalum layer 75 is preferably such that after the etch back/planarization or the etch back the portion of the tantalum layer 75 retained in the recess 70 has a depth sufficient to inhibit silicon diffusion of the polysilicon plugs 65. It can be seen that at this juncture of the process only the upper surface of the tantalum layer 75 is exposed and the tantalum sidewall 80 is protected by the oxide layer 40.

Figure 15:
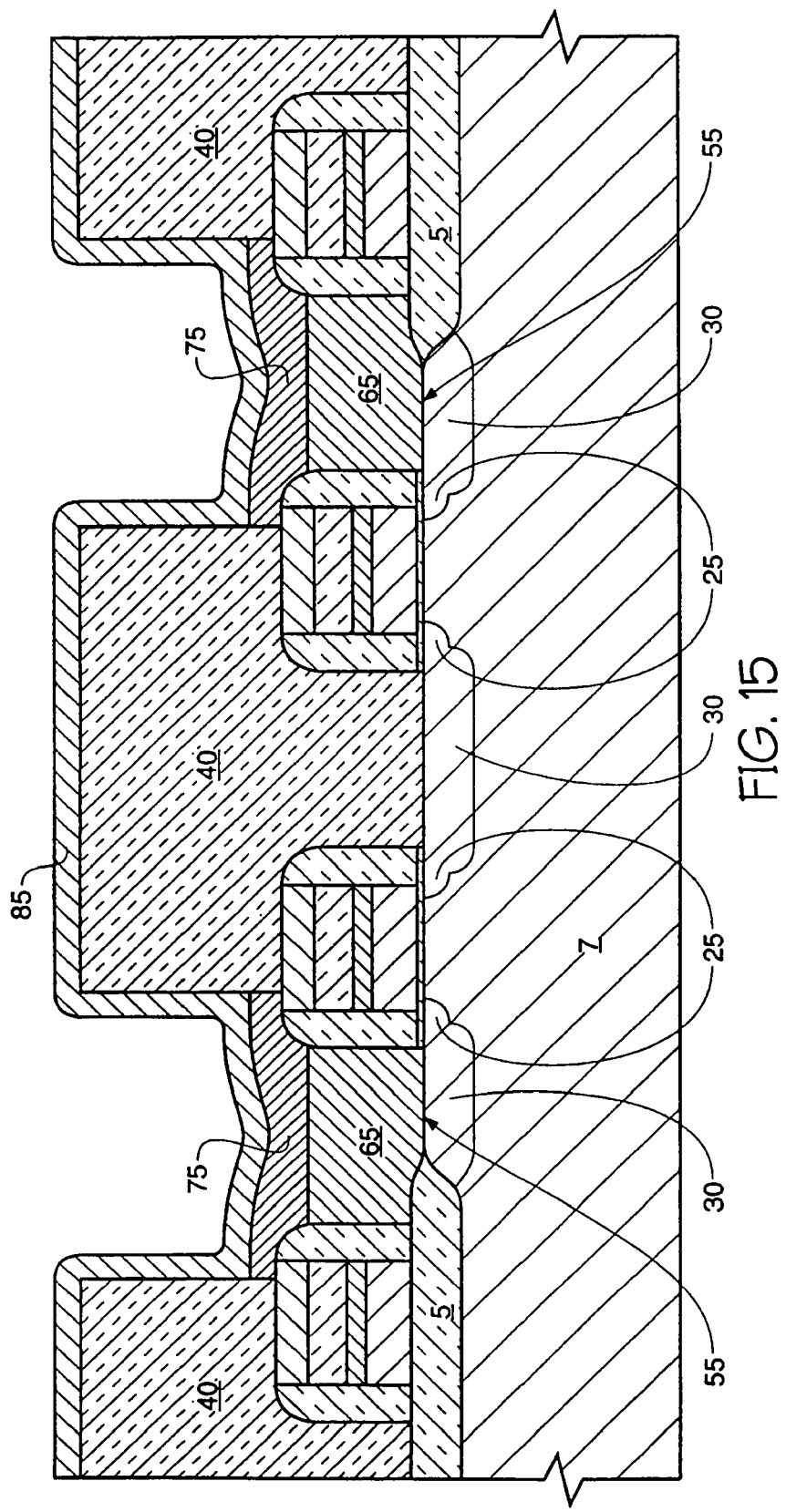
FIG. 15 is the cross sectional view of FIG. 14 following a deposition of an oxidation resistant layer.

Referring now to FIG. 15, a platinum layer 85 is formed by CVD or a sputtering technique. The platinum layer 85 overlies the tantalum layer 75. Since the platinum layer 85 is resistant to oxidation it provides an excellent surface for the deposition of the high dielectric constant material. Other materials which are resistant to oxidation may be used in place of the platinum. For example, $RuO_2$ and TiN, as well as other non-oxidizing materials may be used. In this embodiment of the invention the platinum layer 85 is relatively thin, approximately 50 nm thick, although other thicknesses may be used without departing from the spirit and scope of the invention. The thickness of the platinum should be great enough to substantially protect the tantalum layer 75 against oxidation during BST deposition.

Figure 16:
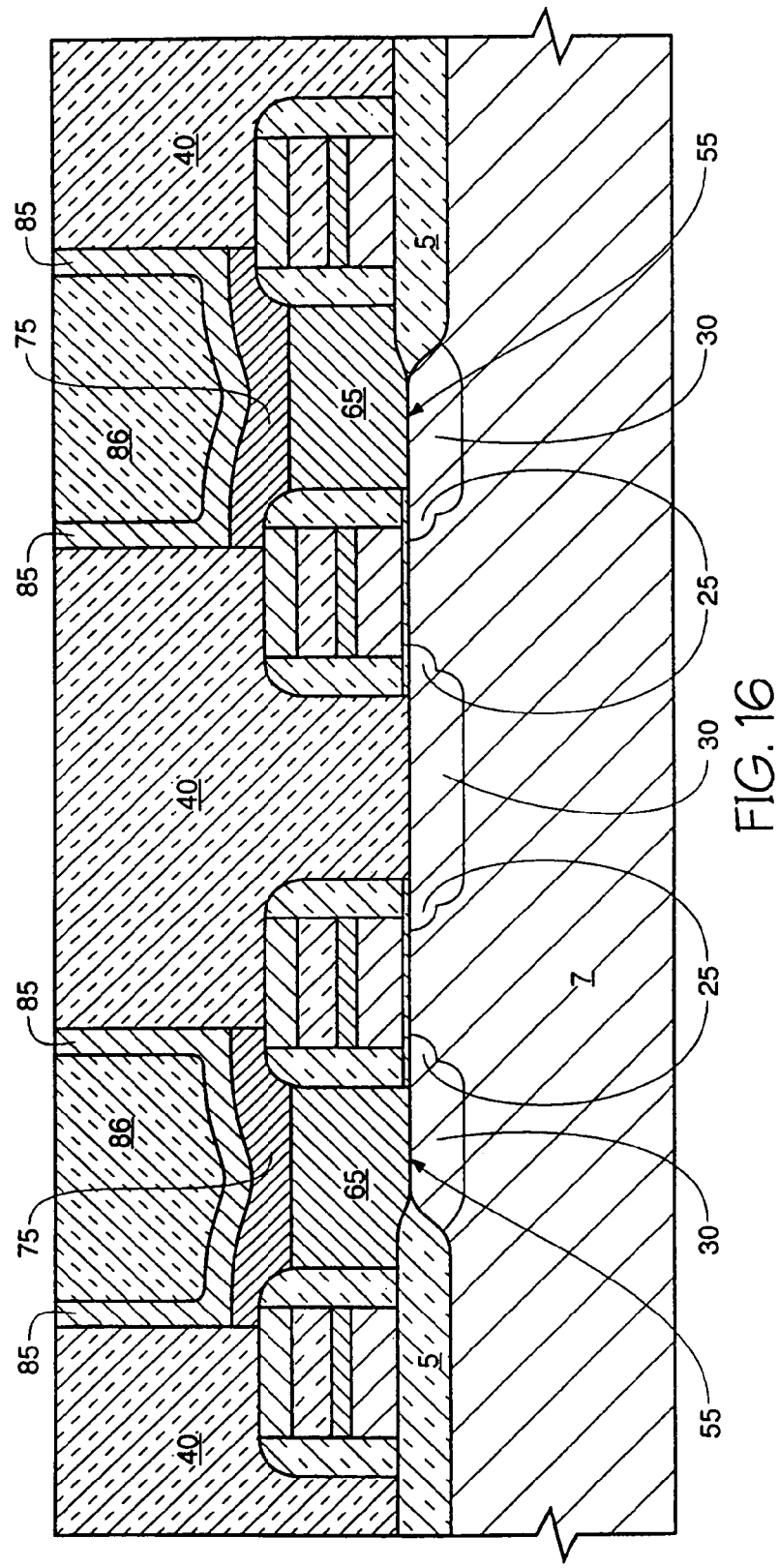
FIG. 16 is the cross sectional view of FIG. 15 following a further oxide deposit and the planarization of the oxide and the oxidation resistant layer.

In FIG. 16 oxide 86 is deposited into the recess 70, and the structure is planarized to remove portions of the platinum layer 85 overlying the oxide layer 40.

Figure 17:
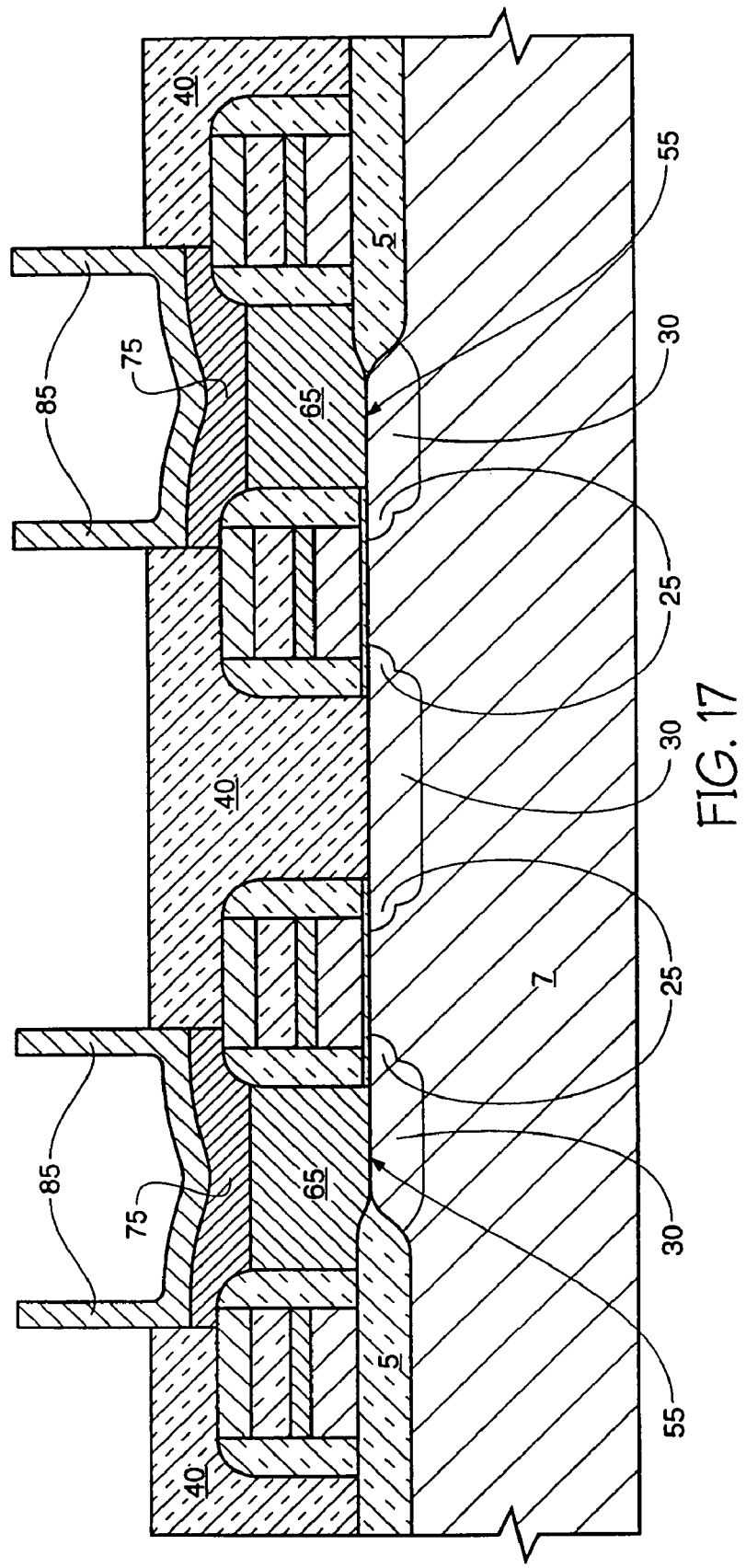
FIG. 17 is the cross sectional view of FIG. 16 following an etch back of the oxide deposits.

In FIG. 17 the oxide layers 40 and 86 have been etched to expose a vertical sidewall of the platinum layer 85 and the upper surface of the platinum layer 85. It is necessary to retain a sufficient quantity of oxide 40 at the lower sidewall of platinum layer 85 to eliminate the possibility of oxidizing the tantalum layer 75. In order to retain sufficient oxide 40 while at the same time exposing the upper surface of the platinum layer 85 the densification of the oxide 86 must be less than the densification of oxide 40 in order for the oxide layer 86 to etch at a faster rate than the oxide layer 40.

Now the fabrication of the crown embodiment the storage node electrode is complete. Although the polysilicon plug 65 is often thought of as an electrical interconnect interposed between the substrate and the storage node electrode, it can be thought of as a portion of the storage node electrode itself.

Figure 18:
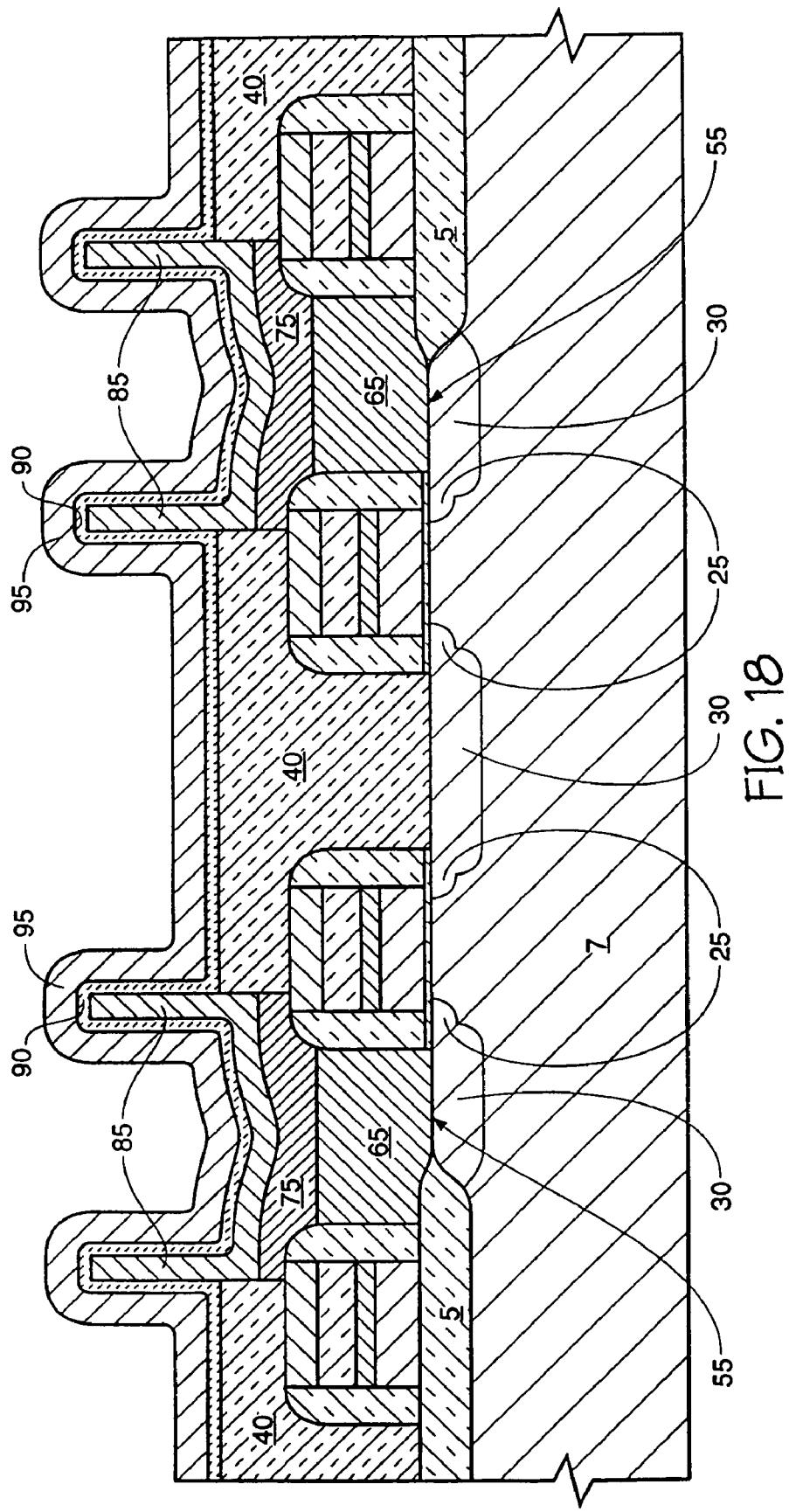
FIG. 18 is the cross sectional view of FIG. 17 following formation of a dielectric layer and cell plate layer.

FIG. 18 depicts initial formation of the storage cell capacitor following a deposition and anneal of a dielectric layer 90 overlying the platinum layer 85. The dielectric layer 90 is typified as having a high dielectric constant. The storage cell capacitor fabrication is completed with the sputter or CVD of a 50 to 200 nm thick cell plate layer 95 to form a cell plate electrode. The cell plate layer 95 is typically platinum, TiN or some other conductive material.

Figure 19:
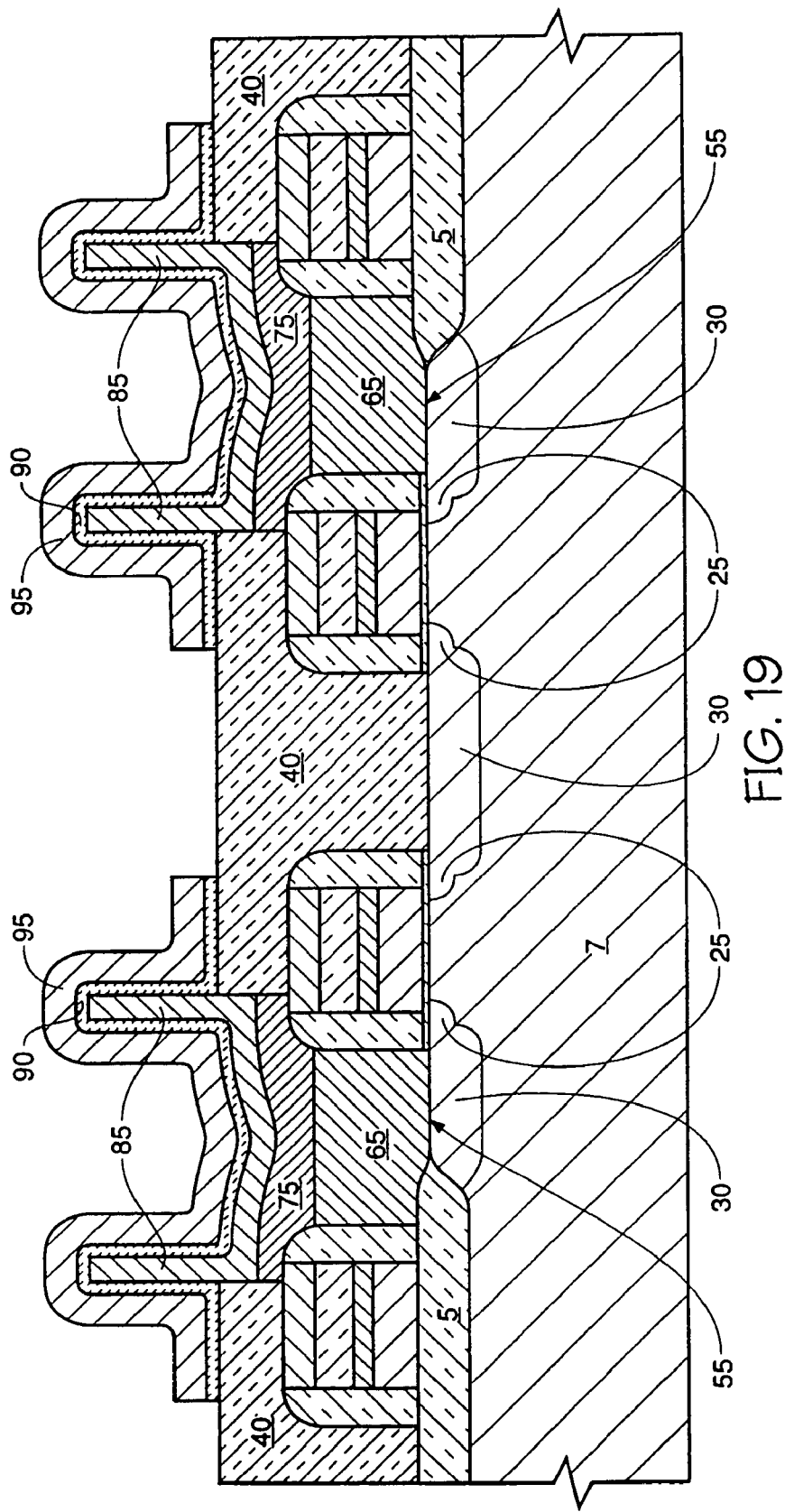
FIG. 19 is the cross sectional view of the capacitor made by the process described in steps 2–5 and 12–19.

Following the deposition of the dielectric layer 90 and the cell plate layer 95 the storage cell capacitor is patterned and the cell plate layer 95 and the dielectric layer 90 are etched to complete the fabrication of the storage cell capacitor as shown in FIG. 19.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In currently envisioned embodiments BST is the preferred material and is deposited at a thickness range of 30 nm–300 nm by RF-magnetron sputtering or CVD. The tantalum layer 75 is not oxidized during the application of a high temperature anneal due to the fact that it is protected on its sidewall by the oxide layer 40 and that it is protected on its upper surface by the platinum layer 85.

The process can be continued or modified to accommodate the steps described in U.S. Pat. No. 5,168,073, previously incorporated by reference, for providing electrical interconnection between a plurality of capacitors thus formed.

By utilizing the method of the invention, a high density memory device is provided featuring a stacked capacitor formed in a compact area as a result of a dielectric layer having a high dielectric constant. The stacked capacitor of the invention retains storage node integrity during an anneal of the dielectric layer.

Figure 20:
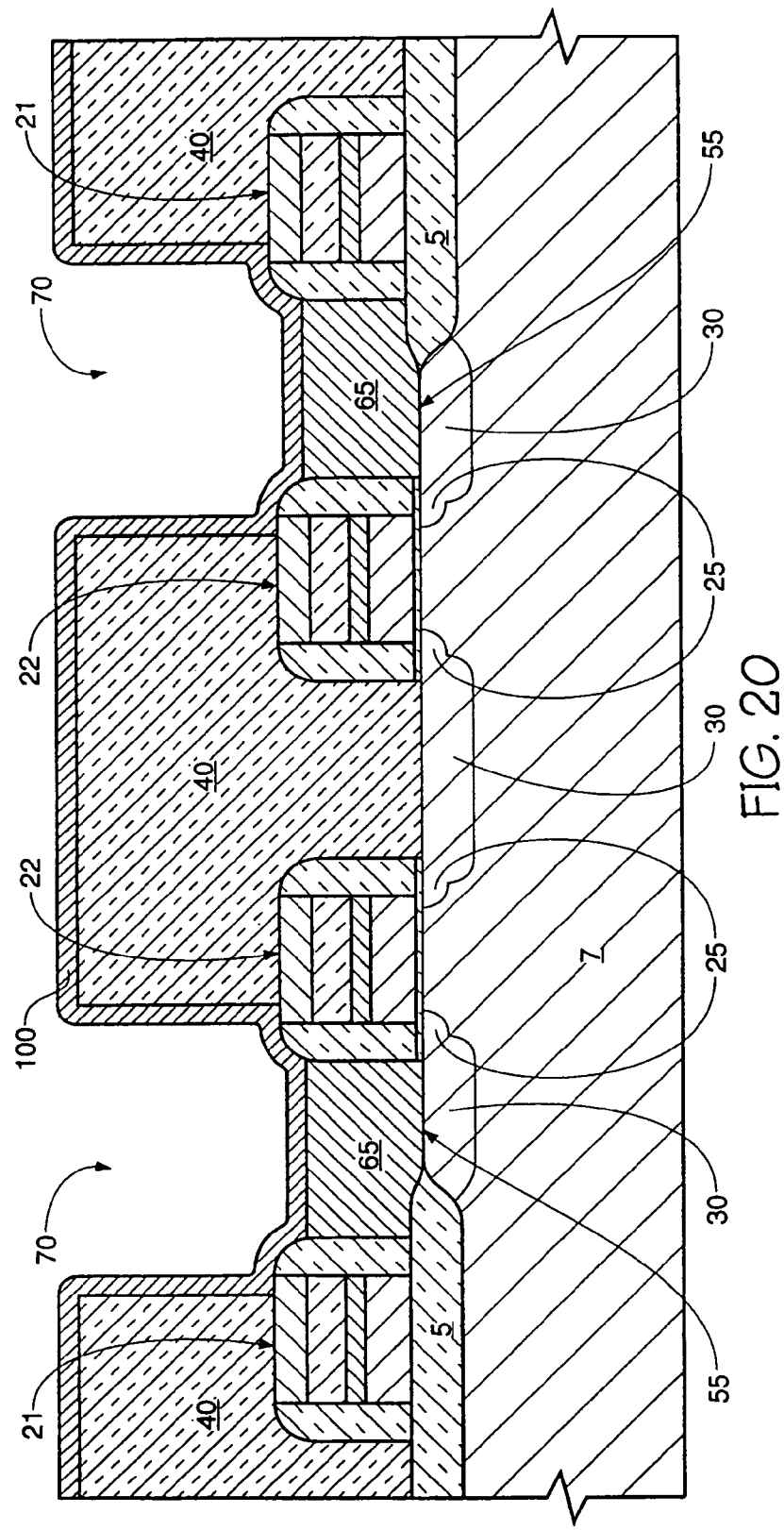
FIG. 20 is the cross sectional view of FIG. 12 following the formation of a conductive layer.

In an alternate embodiment of the crown embodiment, the deposition of the tantalum layer is preceded by a deposition of a titanium barrier layer 100, see FIG. 20. A thermal anneal is performed. The titanium in contact with the polysilicon plug reacts with the polysilicon to form titanium silicide during the anneal. It is possible to perform the anneal in nitrogen. In this case the titanium still reacts with the polysilicon to form titanium silicide, and the titanium which is not in contact with the polysilicon plug reacts with the nitrogen to form TiN. In addition a thin layer of nitrogen is formed overlying the titanium silicide.

In addition to titanium, other metals including refractory metals may be used. These refractory metals may include W, Co, Ta, and Mo.

Alternately a metal nitride, such as TiN, may be deposited instead of a refractory metal. The refractory metal and the metal nitride are both capable of reacting with the polysilicon plug to form a silicide during an anneal.

Figure 21:
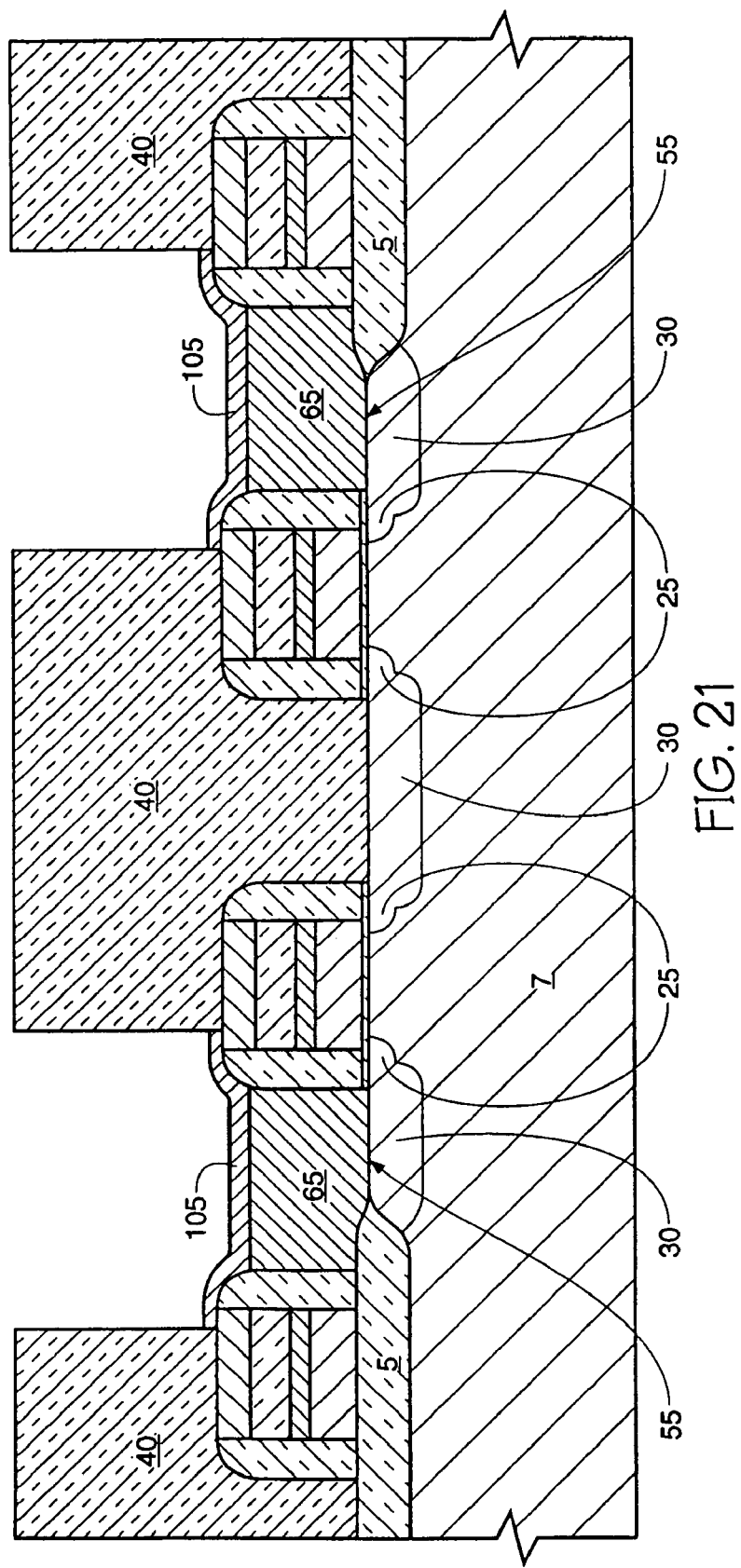
FIG. 21 is the cross sectional view of FIG. 20 following removal of non silicide portions of the refractory metal (or metal nitride) layer.
Figure 22:
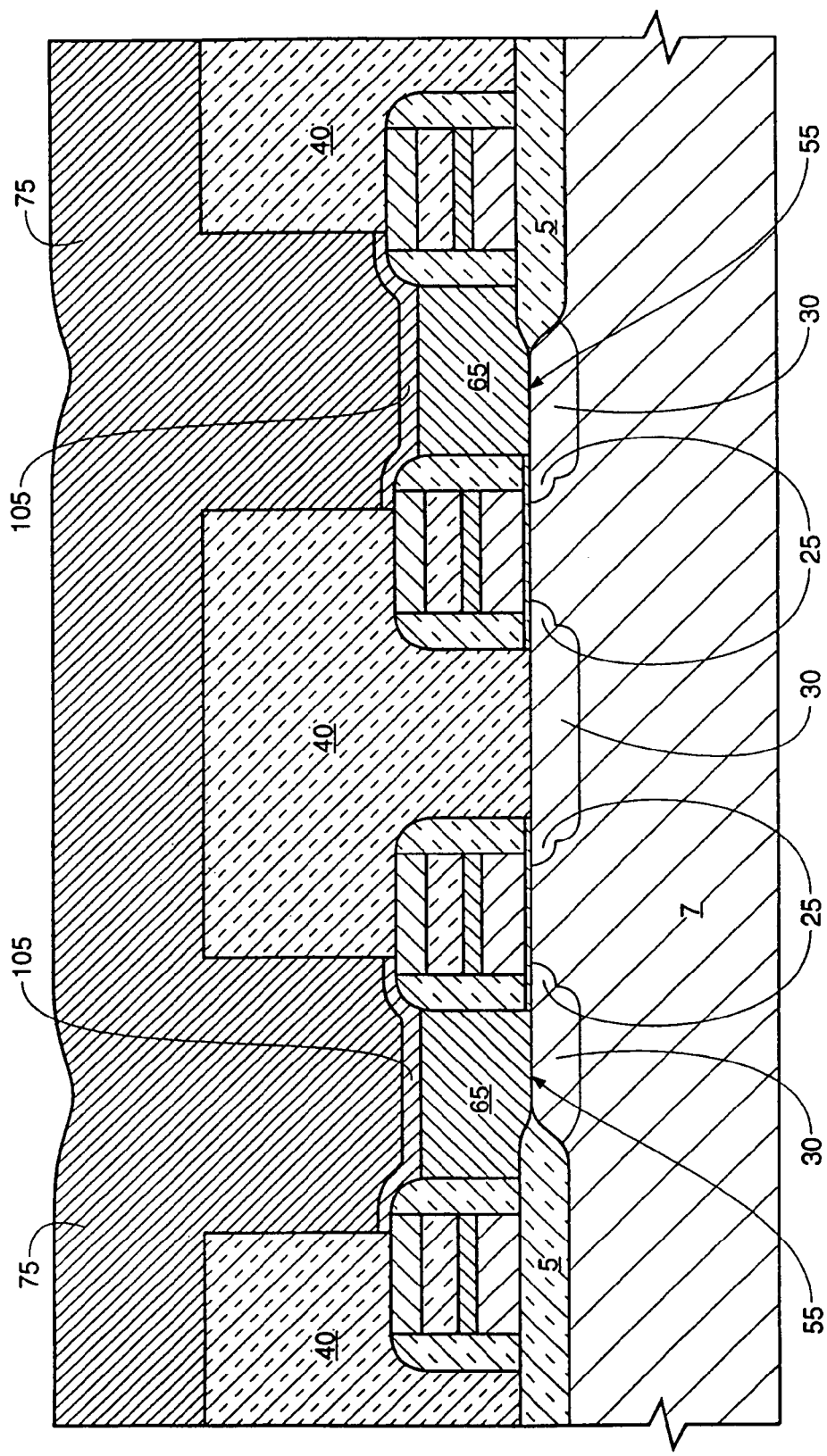
FIG. 22 is the cross sectional view of FIG. 21 following the formation of a barrier layer.
Figure 23:
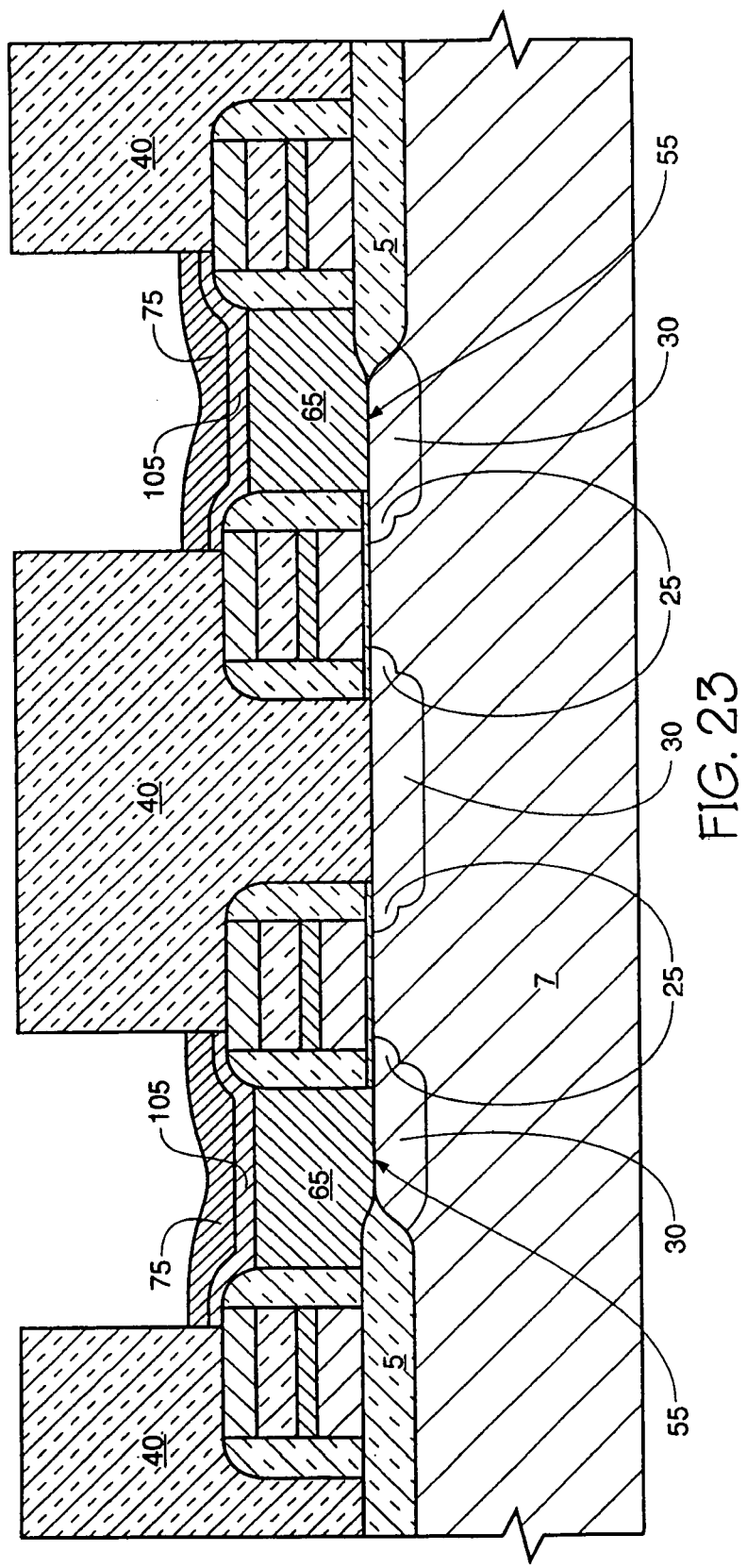
FIG. 23 is the cross sectional view of FIG. 22 following an etch back of the barrier layer.
Figure 24:
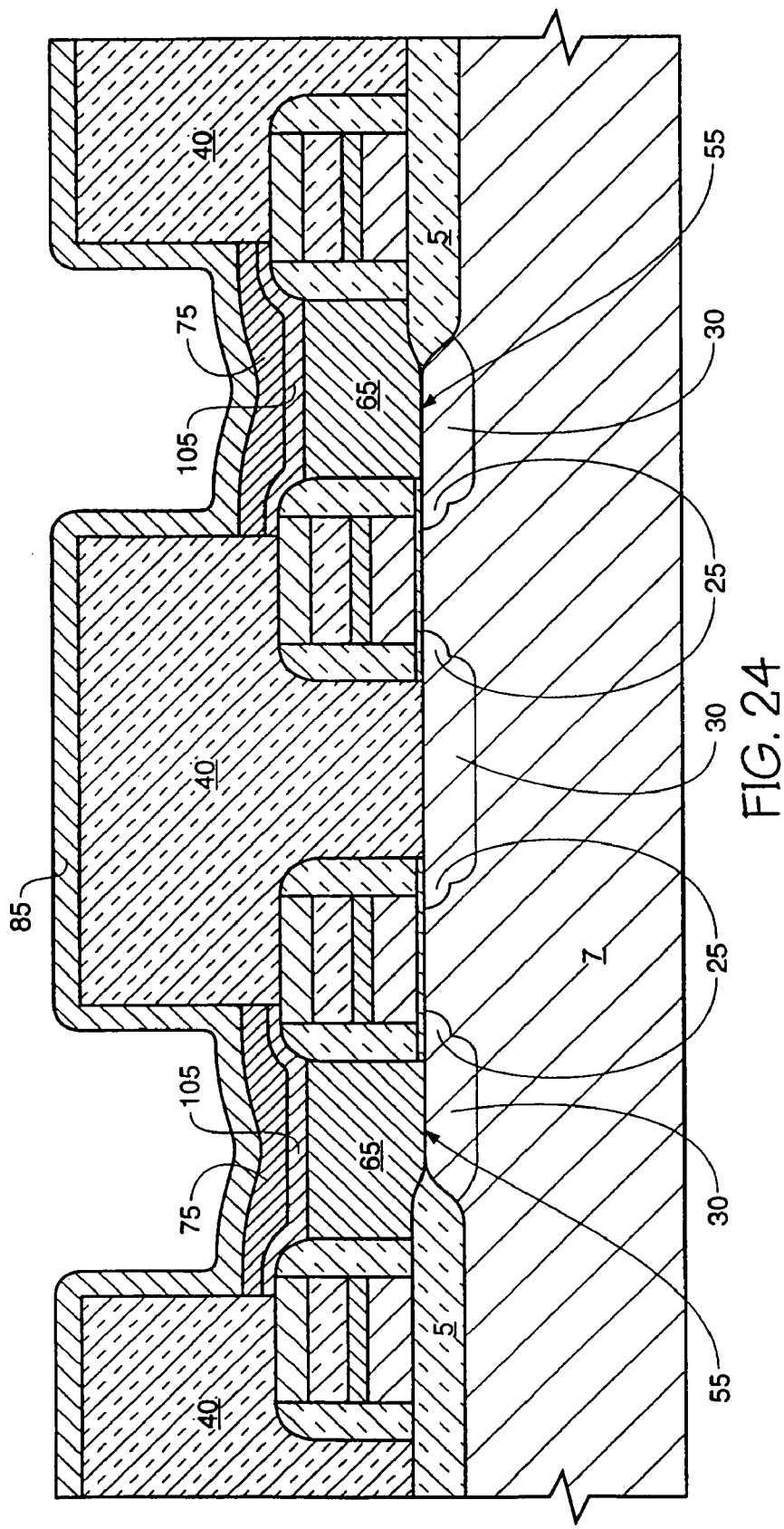
FIG. 24 is the cross sectional view of FIG. 23 following a deposition of an oxidation resistant layer.
Figure 25:
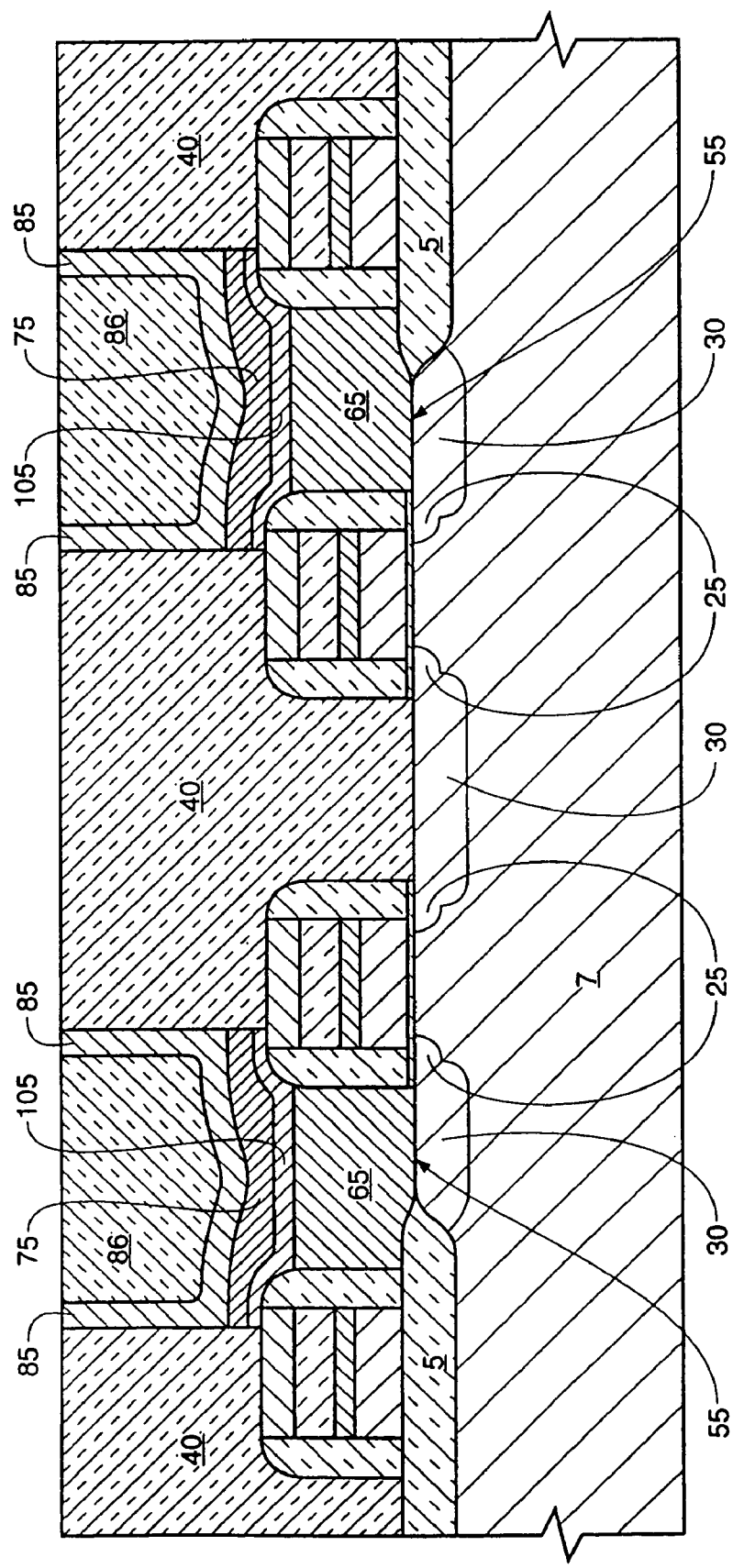
FIG. 25 is the cross sectional view of FIG. 24 following a further oxide deposit and the planarization of the oxide and the oxidation resistant layer.
Figure 26:
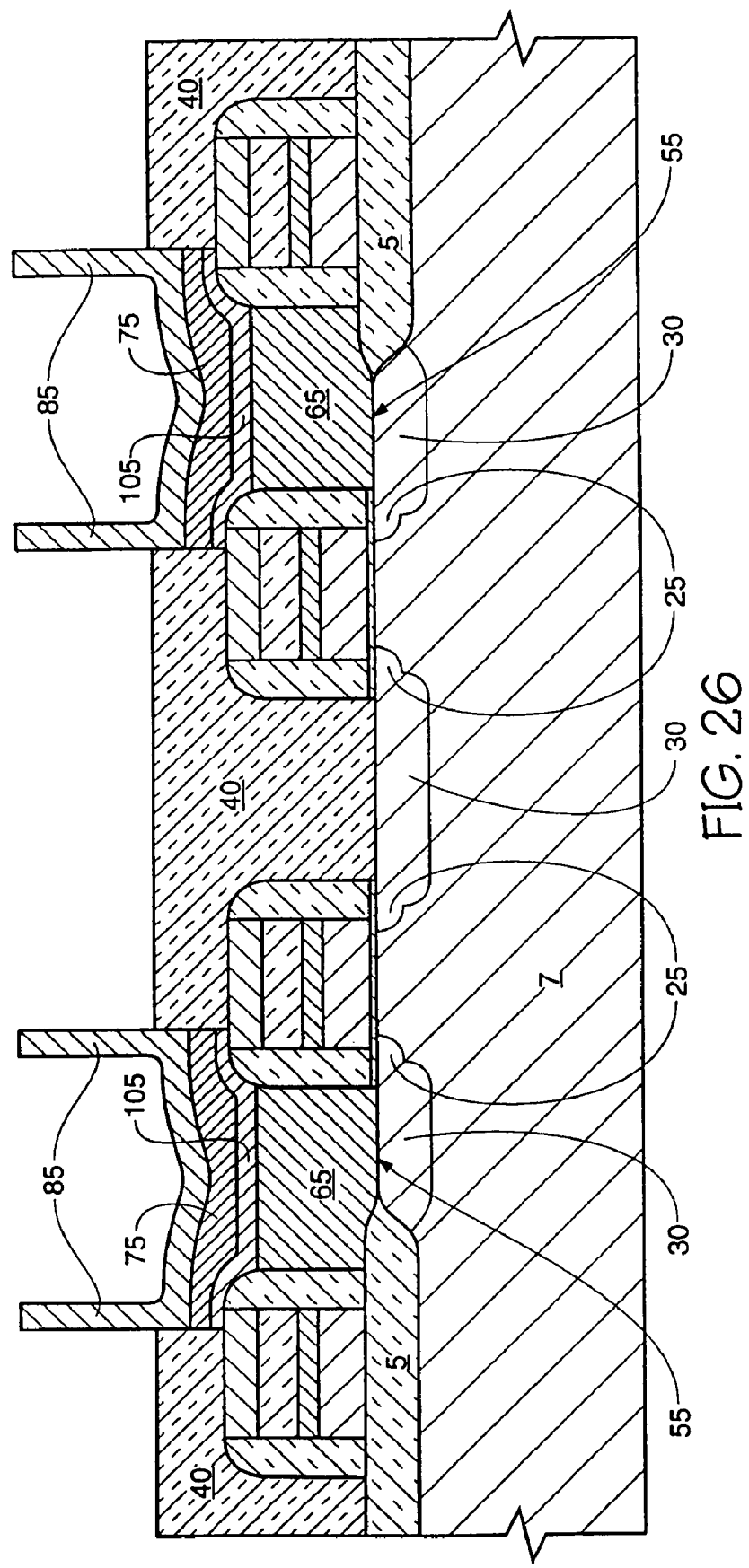
FIG. 26 is the cross sectional view of FIG. 25 following an etch back of the oxide deposits.
Figure 27:
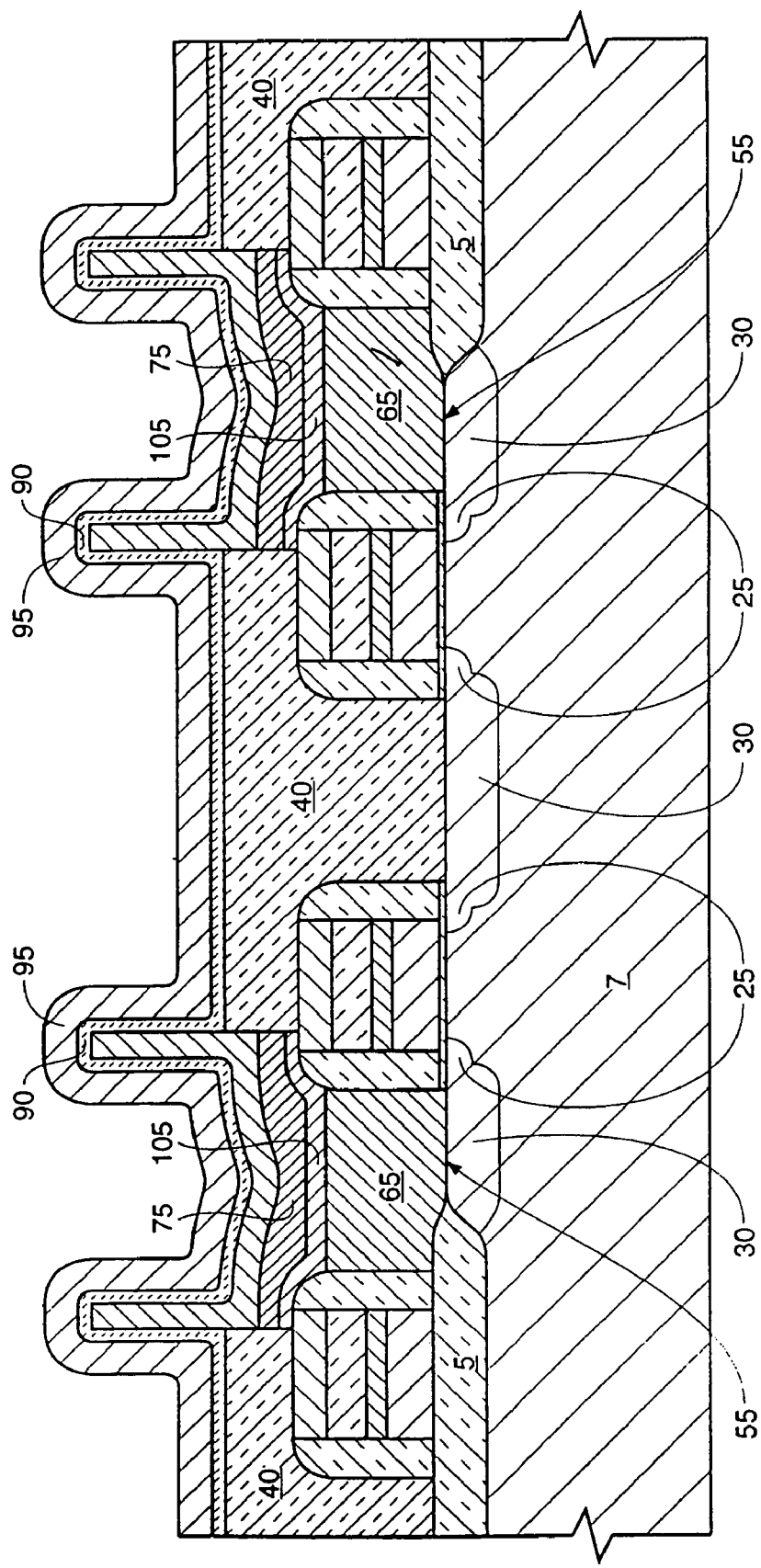
FIG. 27 is the cross sectional view of FIG. 26 following formation of a dielectric layer and cell plate layer.
Figure 28:
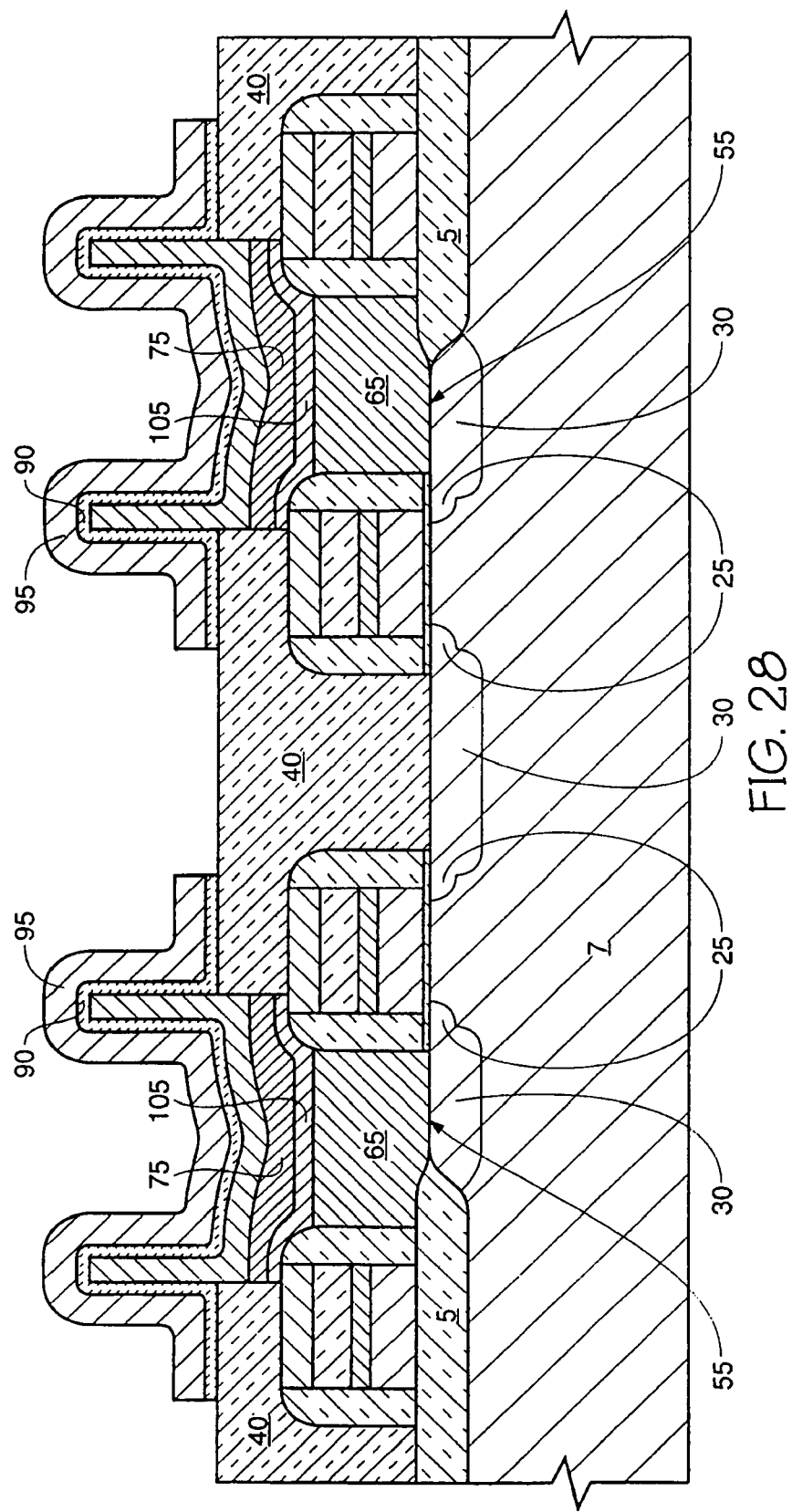
FIG. 28 is the cross sectional view of the capacitor made by the process described in steps 2–5, 12, and 20–28.

Referring now to FIG. 21, the non-silicide layer (the unreacted titanium, in the case of a non-nitrogen anneal, or TiN formed during the nitrogen anneal) and the thin layer of nitrogen formed overlying the titanium silicide 105 have been removed during a wet etch. The titanium silicide 105 overlying the polysilicon plug is retained during the etch.

The process is continued as shown in FIGS. 22–28 and the process corresponds to the process described with respect to FIGS. 13–19, respectively, of the previous embodiment with the exception that the barrier layer 75 is TiN in the present embodiment rather than tantalum which was used in the previous embodiment. However, tantalum, TaN, Ti, $RuO_2$, and Ru may be used.

The titanium silicide layer 105 lowers a contact resistance between the polysilicon plug 65 and the TiN layer 75.

The TiN layer 75 provides a barrier against silicon diffusion of the polysilicon plug and the titanium silicide layer during subsequent high temperature anneals.

Although a process has been described for forming the storage cell capacitor, it is apparent the process is equally applicable for the fabrication of other types of capacitors used in integrated circuits. It should also be apparent to one skilled in the art that changes and modifications, such as deposition depths, may be made thereto without departing from the spirit and scope of the invention as claimed.

What is claimed is:

1. A method for fabricating an electrode, comprising:
   forming a recess in an electrically insulative layer to expose a substrate;
   forming a contact in the recess overlying and in electrical contact with the substrate, wherein the contact includes polysilicon;
   forming a diffusion barrier layer in the recess and overlying the contact;
   forming a conductive oxidation resistant layer in the recess and overlying the diffusion barrier layer;
   removing portions of the conductive oxidation resistant layer lying outside of the recess;
   removing portions of the insulative layer to expose an upper sidewall of said conductive oxidation resistant layer, said diffusion barrier layer inhibiting diffusion of atoms between said contact and said conductive oxidation resistant layer; and
   forming a reducing contact resistance layer interposed between said contact and said diffusion barrier layer, said reducing contact resistance layer configured to reduce a contact resistance between said contact and said diffusion barrier layer, wherein the reducing contact resistance layer includes silicide.

2. The method of claim 1, further comprising:
   forming a further electrically insulative region in the recess to overlie the conductive oxidation resistant layer; and
   removing the further electrically insulative region in the recess during said step of removing portions of the insulative layer to expose the conductive oxidation resistant layer in the recess.

3. The method of claim 1, wherein removing portions of the conductive oxidation resistant layer comprises planarizing the conductive oxidation resistant layer.

4. The method of claim 1, further comprising:
   forming a dielectric layer overlying the conductive oxidation resistant layer; and
   forming a cell plate layer overlying the dielectric layer.

5. A method for fabricating an integrated circuit capacitor, comprising:
   forming an electrically insulative layer overlying a substrate;
   forming an opening in said insulative layer in order to expose said substrate;
   forming a conductive plug in said opening, said conductive plug forming a first portion of a first electrode of said capacitor, wherein the conductive plug includes polysilicon;
   providing a recess in said opening between a surface of said insulative layer and a surface of said conductive plug;
   forming a diffusion barrier layer in said recess such that a sidewall of said diffusion barrier layer is surrounded by said insulative layer, said diffusion barrier layer overlying said conductive plug and forming a second portion of said first electrode;
   forming a conductive oxidation resistant layer overlying said insulative layer and in the recess overlying said diffusion barrier layer, said diffusion barrier layer configured to inhibit diffusion of atoms between said conductive plug and said conductive oxidation resistant layer;
   removing portions of the conductive oxidation resistant layer overlying said insulative layer while retaining portions of said conductive oxidation resistant layer in the recess, remaining portions of the conductive oxidation resistant layer forming a third portion of said first electrode;
   removing portions of said insulative layer to expose an upper portion of a sidewall of said conductive oxidation resistant layer;
   retaining a portion of said insulative layer at a lower portion of said sidewall of said conductive oxidation resistant layer;
   forming a dielectric layer overlying said conductive oxidation resistant layer;
   forming a second electrode overlying said dielectric layer, said first and said second electrodes and said dielectric layer forming the capacitor; and
   forming a reducing contact resistance layer interposed between said conductive plug and said diffusion barrier layer, said reducing contact resistance layer configured to reduce a contact resistance between said conductive plug and said diffusion barrier layer, wherein the reducing contact resistance layer includes silicide.

6. The method of claim 5, wherein forming said insulative layer comprises:
   depositing a first portion of said insulative layer to overlie said substrate; and
   depositing a second portion of said insulative layer to overlie said first portion of said insulative layer, said second portion of said insulative layer having oxidation resistant properties.

7. The method of claim 6, wherein forming said insulative layer includes:
   patterning said second portion of said insulative layer to define the opening; and
   removing exposed regions of said first and second portions of said insulative layer to create the opening.

8. The method of claim 7, wherein forming the insulative layer include planarizing said first portion of said insulative layer.

9. The method of claim 7, further comprising:
   depositing a further insulative layer in said recess to overlie at least a portion of said conductive oxidation resistant layer; and
   removing said further insulative layer during said step of removing portions of said insulative layer.

10. A method for fabricating an electrode, comprising:
    forming an electrically insulative layer overlying a substrate;

masking the insulative layer to define a future opening in the insulative layer;

etching the insulative layer in an exposed region to form the opening and to expose the substrate;

forming a contact to the substrate in the opening, wherein the contact includes polysilicon;

recessing a top surface of the contact from a surface of the insulative layer;

forming a diffusion barrier layer overlying the contact;

removing portions of the diffusion barrier layer overlying the insulative layer;

forming a conductive oxidation resistant layer overlying the diffusion barrier layer;

removing portions of the conductive oxidation resistant layer overlying the insulative layer;

removing upper portions of the insulative layer to expose an upper sidewall of the conductive oxidation resistant layer, wherein said conductive oxidation resistant layer, said diffusion barrier layer, and said contact form the electrode; and forming a reducing contact resistance layer interposed between said contact and said diffusion barrier layer, said reducing contact resistance layer configured to reduce a contact resistance between said contact and said diffusion barrier layer, wherein the reducing contact resistance layer includes silicide.

11. The method of claim 10, wherein forming an electrically insulative layer comprises:

depositing a first portion of said insulative layer to overlie said substrate; and depositing a second portion of said insulative layer to overlie said first portion of said insulative layer, said second portion of said insulative layer having oxidation resistant properties.

12. The method of claim 10, further comprising the following steps:

creating a dielectric layer overlying the conductive oxidation resistant layer; and creating a further electrode overlying the dielectric layer.

* * * * *

UNITED STATES PATENT AND TRADEMARK OFFICE
CERTIFICATE OF CORRECTION

PATENT NO.        : 7,253,052 B2                                        Page 1 of 1
APPLICATION NO.   : 10/896442
DATED             : August 7, 2007
INVENTOR(S)       : Fazan et al.

It is certified that error appears in the above-identified patent and that said Letters Patent is hereby corrected as shown below:

In column 1, line 14 (Approx.), below "now abandoned."
insert -- A continuation of Ser. No. 08/313,677 filed on Sep. 27, 1994, now U.S. Pat. No. 5,506,166 which is a divisional of Ser. No. 08/104,525 filed on Aug. 10, 1993, now U.S. Pat. No. 5,381,302 and which may contain similar material. All of the above applications are incorporated herein by reference. --.

In column 1, line 44, delete "kilobites" and insert -- kilobits --, therefor.

In column 6, line 14, delete "RuO2" and insert -- $RuO_2$ --, therefor.

In column 6, line 21, after "(μm)" insert -- . --.

Signed and Sealed this

Fifth Day of August, 2008

JON W. DUDAS
*Director of the United States Patent and Trademark Office*